US009500956B2

(12) United States Patent
Saenger et al.

(10) Patent No.: US 9,500,956 B2
(45) Date of Patent: Nov. 22, 2016

(54) OPTICAL SYSTEM OF A MICROLITHOGRAPHIC PROJECTION EXPOSURE APPARATUS, AND MICROLITHOGRAPHIC EXPOSURE

(71) Applicant: Carl Zeiss SMT GmbH, Oberkochen (DE)

(72) Inventors: Ingo Saenger, Heidenheim (DE); Joerg Zimmermann, Aalen (DE); Johannes Ruoff, Aalen (DE); Martin Meier, Heidenheim (DE); Frank Schlesener, Oberkochen (DE); Christoph Hennerkes, Huettlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 293 days.

(21) Appl. No.: 14/143,878

(22) Filed: Dec. 30, 2013

(65) Prior Publication Data

US 2014/0132942 A1    May 15, 2014

Related U.S. Application Data

(63) Continuation of application No. PCT/EP2012/063102, filed on Jul. 5, 2012.

(60) Provisional application No. 61/511,645, filed on Jul. 26, 2011, provisional application No. 61/610,675, filed on Mar. 14, 2012.

(30) Foreign Application Priority Data

Jul. 26, 2011  (DE) .................. 10 2011 079 837
Mar. 14, 2012  (DE) .................. 10 2012 203 959

(51) Int. Cl.
*G03F 7/20* (2006.01)
*G02B 27/28* (2006.01)

(52) U.S. Cl.
CPC ......... *G03F 7/70191* (2013.01); *G02B 27/283* (2013.01); *G03F 7/70108* (2013.01); *G03F 7/70116* (2013.01); *G03F 7/70566* (2013.01)

(58) Field of Classification Search
CPC ........... G03F 7/70091; G03F 7/70033; G03F 7/70191; G03F 7/70208; G03F 7/70116; G03F 7/702; G03F 7/70108; G03F 7/70566; G02B 27/283

See application file for complete search history.

(56) References Cited

U.S. PATENT DOCUMENTS

| 5,572,287 A | 11/1996 | Wangler et al. |
| 5,675,401 A | 10/1997 | Wangler et al. |

(Continued)

FOREIGN PATENT DOCUMENTS

| DE | 44 12 053 A1 | 12/1995 |
| DE | 44 21 053 | 12/1995 |

(Continued)

OTHER PUBLICATIONS

International Search Report and Written Opinion for corresponding PCT Appl No. PCT/EP2012/063102, dated Mar. 1, 2013.

(Continued)

*Primary Examiner* — Steven H Whitesell Gordon
(74) *Attorney, Agent, or Firm* — Fish & Richardson P.C.

(57) ABSTRACT

The disclosure relates to optical systems of a microlithographic projection exposure apparatus, and to a microlithographic exposure method. According to an aspect of the disclosure, an optical system has a light source, a ray-splitting optical element, which splits a light ray incident on this element when the projection exposure apparatus is in operation into a first partial ray and a second partial ray, with the first and the second partial ray having mutually orthogonal polarization directions, and at least one ray-deflecting optical element for generating a desired polarized illumination setting from the first partial ray and the second partial ray, wherein the ray-splitting optical element is arranged such that light incident on this ray-splitting optical element when the projection exposure apparatus is in operation has a degree of polarization of less than one.

18 Claims, 18 Drawing Sheets

(56) References Cited

U.S. PATENT DOCUMENTS

| | | |
|---|---|---|
| 6,999,172 B2 | 2/2006 | Masaki et al. |
| 7,154,666 B2 | 12/2006 | Wedowski |
| 8,395,754 B2 | 3/2013 | Endres et al. |
| 2003/0038225 A1* | 2/2003 | Mulder .............. G03F 7/70116 250/205 |
| 2005/0094268 A1 | 5/2005 | Fiolka et al. |
| 2005/0134825 A1 | 6/2005 | Schuster |
| 2005/0140958 A1 | 6/2005 | Fiolka et al. |
| 2006/0072207 A1 | 4/2006 | Williams et al. |
| 2007/0195305 A1 | 8/2007 | Mulder et al. |
| 2008/0192225 A1 | 8/2008 | Mann et al. |
| 2010/0165318 A1 | 7/2010 | Fiolka et al. |
| 2010/0315616 A1 | 12/2010 | Deguenther |
| 2011/0122392 A1 | 5/2011 | Fiolka et al. |

FOREIGN PATENT DOCUMENTS

| | | | |
|---|---|---|---|
| DE | 101 09 242 | 6/2002 | |
| DE | 102 06 061 A1 | 9/2003 | |
| DE | 103 11 809 A1 | 10/2003 | |
| DE | 10 2005 060 517 A1 | 6/2007 | |
| DE | 10 2007 043 958 A1 | 4/2009 | |
| DE | 10 2008 002 749 | 12/2009 | |
| DE | WO 2009156038 A1 * | 12/2009 | ......... G03F 7/70075 |
| DE | 10 2008 041 801 | 3/2010 | |
| DE | 10 2009 054 540 A1 | 6/2011 | |
| EP | 0 658 810 A1 | 6/1995 | |
| EP | 1 356 476 B1 | 10/2003 | |
| EP | 1 826 616 | 8/2007 | |
| JP | 2003-022967 | 1/2003 | |
| JP | 2007-227918 | 9/2007 | |
| WO | WO 02/059905 | 8/2002 | |
| WO | WO 2005/017620 A2 | 2/2005 | |
| WO | WO 2009/054541 | 4/2009 | |
| WO | WO 2009/152867 | 12/2009 | |
| WO | WO 2013/156278 A1 | 10/2013 | |

OTHER PUBLICATIONS

German Office Action, with English translation, for corresponding DE Appl No. 10 2011 079 837.4, dated Oct. 5, 2012.
German Office Action, with English translation, for corresponding DE Appl No. DE 10 2012 203 959.7, dated Nov. 7, 2012.
International Preliminary Report on Patentability for corresponding PCT Appl No. PCT/EP2012/063102, dated Feb. 6, 2014.
Japanese Office Action, with translation thereof, for corresponding JP Appl No. 2014-522019, dated May 27, 2016.
Taiwanese Office Action and Search Report, with translation thereof, for corresponding TW appl No. 101124747, dated Aug. 3, 2016.

* cited by examiner

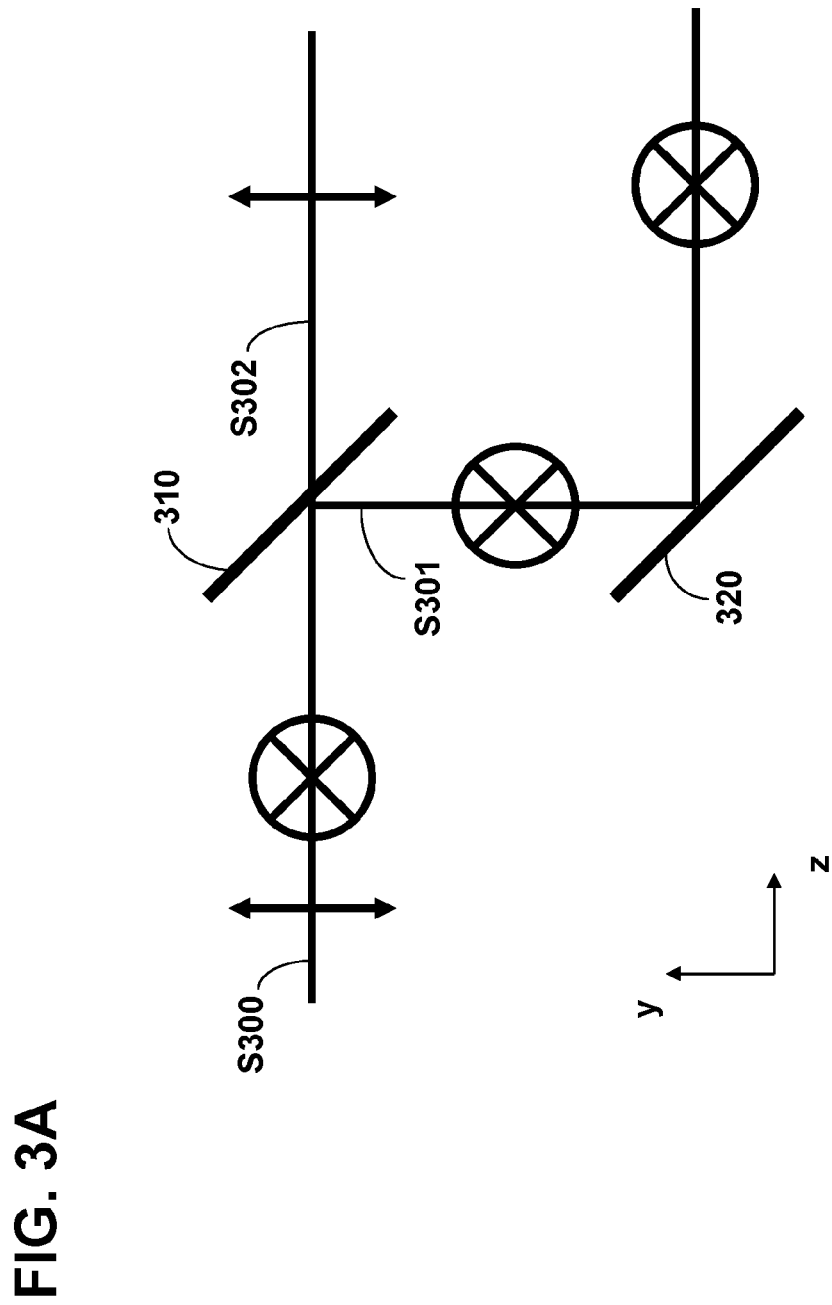

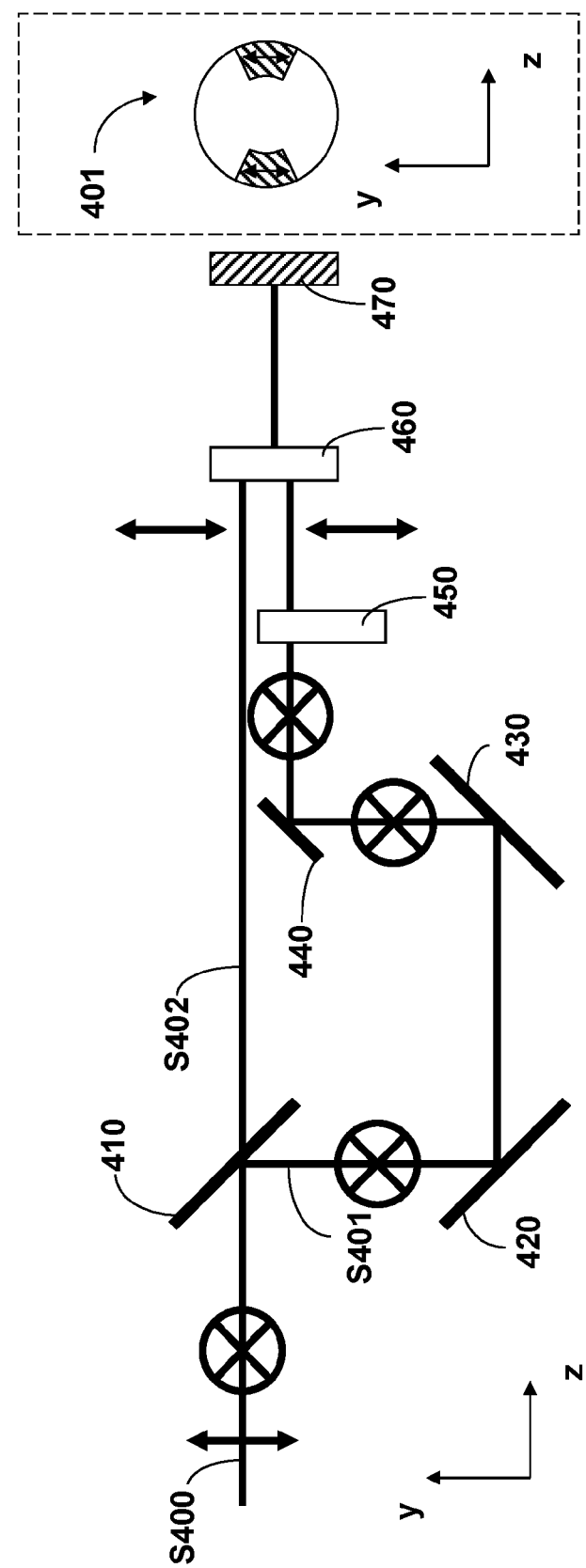

FIG. 9
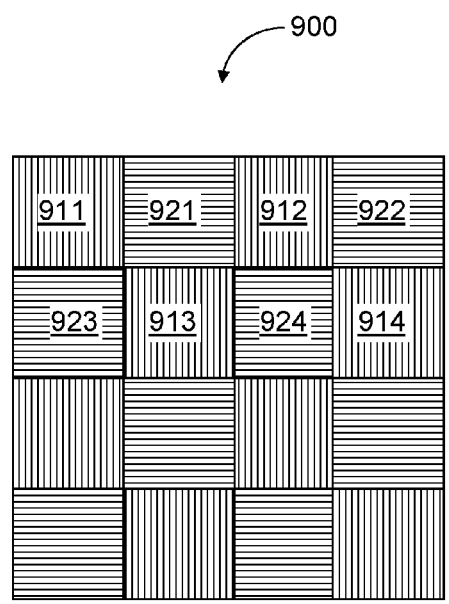
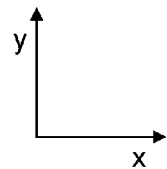

OPTICAL SYSTEM OF A MICROLITHOGRAPHIC PROJECTION EXPOSURE APPARATUS, AND MICROLITHOGRAPHIC EXPOSURE

CROSS REFERENCE TO RELATED APPLICATIONS

This application claims priority of German Patent Application 10 2011 079 837.4 and U.S. Provisional Application No. 61/511,645, both filed on Jul. 26, 2011. This application further claims priority of German Patent Application 10 2012 203 959.7 and U.S. Provisional Application No. 61/610,675, both filed on Mar. 14, 2012. The content of these applications is hereby incorporated by reference.

BACKGROUND OF THE INVENTION

1. Field of the Invention

The invention relates to an optical system of a microlithographic projection exposure apparatus, and to a microlithographic exposure method.

2. State of the Art

Microlithography is used to produce microstructured components such as, for example, integrated circuits or LCDs. The microlithography process is carried out in a so-called projection exposure apparatus, which has an illumination device and a projection lens. The image of a mask (=reticle) illuminated via the illumination device is in this case projected via the projection lens onto a substrate (e.g. a silicon wafer) coated with a light-sensitive layer (photoresist) and arranged in the image plane of the projection lens, in order to transfer the mask structure to the light-sensitive coating of the substrate.

In the illumination device, various approaches are known for setting specific polarization distributions in the pupil plane and/or in the reticle in a targeted manner in order to optimize the image contrast. Here, the so-called IPS value ("Intensity in Preferred State"), which describes the degree of polarization in a desired state, is of fundamental importance. By way of example, an undesired reduction of the IPS value can in practice result from stress birefringence occurring in the optical elements or lens elements of the illumination device and this can more particularly lead to the polarization state becoming elliptical or, although still having the desired preferred polarization direction, having a light component that is not polarized in the desired direction. In this case, the IPS value can be increased by compensating for this ellipticity.

Proceeding from already polarized light (e.g. as a result of using a laser-light source supplying already polarized light), various approaches are known for achieving a desired polarized illumination setting by rotating the polarization direction and for putting together the intensity distribution in the pupil plane from appropriately polarized light components. In respect of the prior art, reference is made in purely exemplary fashion to WO 2009/054541 A2. However, in practice, the situation may also arise where at least parts of the illumination light are unpolarized. This is particularly the case in systems in which the light source generates light which is unpolarized from the outset, i.e., for example, in a projection exposure apparatus designed for EUV or else in an illumination device utilizing the i-line (with a wavelength of approximately 365 nm) as illumination light.

Furthermore, during the operation of a projection exposure apparatus there is a need to set specific polarization distributions in the pupil plane and/or in the reticle in the illumination device for optimizing the imaging contrast and also to be able to make a change to the polarization distribution during the operation of the projection exposure apparatus. With regard to the prior art concerning changing the polarization distribution in projection exposure apparatuses designed for the EUV range, merely by way of example reference is made to DE 10 2008 002 749 A1 and US 2008/0192225 A1.

Furthermore, and according to a further aspect of the present disclosure, there may also be a need to at least partly depolarize illumination light for certain illumination settings. Realization of such at least partly depolarized settings may in particular raise problems in situations where the light is already polarized, e.g. due to the use of a polarized light source. Realization of at least partly depolarized settings may in particular be difficult in EUV systems, since conventional depolarizing concepts (such as the use of a so-called Hanle-depolarizer in combination with a light mixing system) are not available in the EUV range due to the non-availability of optically transmissive components.

SUMMARY OF THE INVENTION

According to one aspect, it is an object of the present disclosure to provide an optical system of a microlithographic projection exposure apparatus and a microlithographic exposure method, which allow as efficient generation as possible of a desired polarized illumination setting from at least partly unpolarized light.

This object is achieved in accordance with the features of the independent claim 1.

An optical system according to a first aspect of the disclosure of a microlithographic projection exposure apparatus has:

- a light source;
- a ray-splitting optical element, which splits a light ray incident on this element when the projection exposure apparatus is in operation into a first partial ray and a second partial ray, with the first and the second partial ray having mutually orthogonal polarization directions; and
- at least one ray-deflecting optical element for generating a desired polarized illumination setting from the first partial ray and the second partial ray;
- wherein the ray-splitting optical element is arranged such that light incident on this ray-splitting optical element when the projection exposure apparatus is in operation has a degree of polarization of less than one.

The disclosure according to the above aspect is based on the concept of increasing the degree of polarization in a microlithographic projection exposure apparatus with as little light loss as possible, proceeding from input light which is unpolarized or has a low degree of polarization. This increase in the degree of polarization is brought about by splitting the input light into two partial rays having mutually orthogonal polarization, which in turn are "processed further" such that, ultimately, the desired polarized illumination setting is achieved. This increases the degree of polarization, with, at the same time, it being possible to avoid the light losses (which can typically be of the order of 50%) accompanying the conventional usual use of a polarizer.

In particular, the disclosure according to the above aspect does not follow the concept generally implemented in conventional known approaches of merely rotating an already present preferred polarization direction and thus only increasing the polarization purity (PP) in the case of unchanging degree of polarization (DoP), i.e. of implementing a transition from right to left within the diagram of FIG. 6. Rather, the disclosure according to the above aspect contains the process of increasing the degree of polarization itself (corresponding to a transition in the diagram of FIG. 6 "from the bottom upward")—to be precise, with as little light loss as possible. In doing so, within the scope of the disclosure, there is not necessarily a transition within the same column in the diagram of FIG. 6 from the bottom upward, but rather it is also possible to generate two mutually perpendicularly polarized partial rays (corresponding to the fields shown to the left or right in the first row of FIG. 6)—depending on the ultimately desired polarized illumination setting. It is self-evident that the desired polarization state can also correspond to the polarization direction shown in the central field in the first row of FIG. 6 (which runs at 45° to the y-direction) in further exemplary applications.

The relationship between the aforementioned variables of degree of polarization and polarization purity is given by $$IPS=DoP*(PP-0.5)+0.5 \quad (1),$$

where DoP denotes the degree of polarization, PP denotes the polarization purity and IPS denotes the intensity in the desired polarization state (intensity in preferred state).

The disclosure according to the above aspect is not restricted to increasing the degree of polarization from 0% (corresponding to unpolarized light) to substantially 100% (corresponding to completely polarized light with a constant polarization direction). Rather, a further advantageous application of the disclosure also consists of increasing the degree of polarization, for example after a mirror present in the illumination ray path (which of course already brings about a partial polarization), i.e. for merely partly polarized light. According to the disclosure, this is likewise brought about by splitting the light ray into two partial rays with mutually orthogonal polarization states.

According to one embodiment, the ray-splitting optical element is arranged such that light incident on this ray-splitting optical element when the projection exposure apparatus is in operation has a degree of polarization of less than 0.5, in particular of less than 0.3, more particularly of less than 0.1.

By way of example, the desired polarized illumination setting can have a quasi-tangential polarization distribution. Furthermore, the desired polarized illumination setting can be a quadrupole illumination setting or a dipole illumination setting.

In particular, the light source can be a light source generating the i-line (with a wavelength of approximately 365 nm), in the form of a mercury short-arc discharge lamp.

The ray-deflecting element can, in particular, have a diffractive optical element (DOE).

The ray-splitting element can more particularly have a polarizing beam splitter, a sub-lambda grating, a multiple-layer membrane or a birefringent element.

The light source can furthermore also be an EUV plasma source. In this case, the ray-splitting element can e.g. have a zirconium film, as will still be explained in more detail below.

According to one embodiment, at least one rotator for rotating the polarization state, in particular by 90°, is arranged in the ray path of one of the two partial rays.

According to one embodiment, a diffuser is arranged in the ray path of the two partial rays.

The disclosure furthermore relates to a microlithographic projection exposure apparatus with an illumination device and a projection lens, wherein the illumination device has an optical system with the above-described features.

According to one embodiment, the optical system comprises an arrangement composed of a plurality of first facets and at least a plurality of second facets, wherein the first facets and the second facets are assigned different polarization states of the light reflected at the respective facets during the operation of the projection exposure apparatus; and an arrangement composed of a plurality of third facets, wherein third facets are arranged downstream of the first and the second facets in the light propagation direction;

wherein the third facets are switchable in each case between a first switching position, in which they capture light from one of the first facets during the operation of the projection exposure apparatus, and at least one second switching position, in which they capture light from one of the second facets during the operation of the projection exposure apparatus.

According to this aspect, the present disclosure provides an optical system of a microlithographic projection exposure apparatus, in particular for operation in the EUV, which enables an increased flexibility with regard to the polarization distribution that can be set in the projection exposure apparatus. This aspect is not restricted to the afore-described concept of increasing the degree of polarization in the microlithographic projection exposure apparatus, but also advantageous independent thereof.

Therefore, in a further embodiment the disclosure also relates to an optical system of a microlithographic projection exposure apparatus, more particularly for operation in the EUV, wherein the optical system comprises an arrangement composed of a plurality of first facets and at least a plurality of second facets, wherein the first facets and the second facets are assigned different polarization states of the light reflected at the respective facets during the operation of the projection exposure apparatus; and an arrangement composed of a plurality of third facets, wherein the third facets are arranged downstream of the first and the second facets in the light propagation direction;

wherein the third facets are switchable in each case between a first switching position, in which they capture light from one of the first facets during the operation of the projection exposure apparatus, and at least one second switching position, in which they capture light from one of the second facets during the operation of the projection exposure apparatus.

According to this aspect, the disclosure is based on the concept of providing a selection possibility with regard to the polarization state of the light rays reflected at the third facets (typically realized on a pupil facet mirror) by virtue of the fact that firstly the third facets are embodied such that they are switchable between at least two switching positions, and secondly at least two groups of first and second facets (which are typically realized on one or a plurality of field facet mirrors), the groups being arranged upstream of the third facets in the light propagation direction, are configured in such a way that different polarization states are applied to the light reflected at the first and second facets, respectively.

In particular, therefore, the present disclosure includes the concept of not configuring the pupil facet mirror in a conventional manner with respectively stationary facets, but rather embodying the facets on the pupil facet mirror such that they are adjustable in each case in terms of their tilting angle independently of one another (wherein this adjustability can be alternatively realized continuously or else as stepwise adjustability in two or more discrete switching positions or tilting angles). In other words, according to the disclosure—in addition to the field facet mirror already conventionally configured with adjustable facets—the pupil facet mirror is also configured to be dynamically adjustable in order to be able to select different polarization states for the light spots ultimately generated by the individual facets of the pupil facet mirror.

As a result, the disclosure affords the possibility, in particular, of realizing the flexible change in the polarization (for instance in the polarization distribution generated in a pupil plane) dynamically during ongoing operation of the projection exposure apparatus, without this necessitating, for instance, the replacement of polarization-influencing elements in the system.

In accordance with one embodiment, the first facets and the second facets can be in each case provided as continuous facet mirror regions. In this case, these continuous facet mirror regions can be alternatively provided as spatially separated regions of the same facet mirror or on separate facet mirrors.

In accordance with one embodiment, the first facets and the second facets can also be provided in an alternate arrangement on one and the same facet mirror. Such a configuration has the advantage that two facets respectively assigned to one and the same facet of the pupil facet mirror and having different assigned polarization states can e.g. also in each case be arranged directly adjacent and thus require, for a "changeover" of the polarization state of the relevant light spot, smaller switching distances or tilting angles of the relevant assigned facet of the pupil facet mirror.

In accordance with one embodiment, the third facets are arranged on a pupil facet mirror. Furthermore, the first facets and the second facets can in each case be arranged on a field facet mirror.

In accordance with one embodiment, the different polarization states are orthogonal with respect to one another. However, the disclosure is not restricted thereto, and so it also encompasses configurations in which the different polarization states generated by one and the same facet of the third facets differ from one another in some other way, for example by any desired angle between the relevant polarization directions.

The different polarization states can be generated, in particular, by conversion of light from a light source that generates unpolarized light.

In accordance with one embodiment, the different polarization states are in each case generated by a ray-splitting optical element, which brings about splitting of a light ray impinging on the element during the operation of the projection exposure apparatus into a first partial ray and a second partial ray, wherein the first and the second partial rays have polarization directions orthogonal with respect to one another.

In this case, at least one ray-deflecting optical element can be provided downstream of the ray-splitting optical element in the light propagation direction.

In accordance with a further embodiment, the different polarization states are in each case generated by a reflection at a respective reflective element, the reflection being effected at the Brewster angle. In this case, the relevant reflective elements can be formed by the first and the second facets, respectively. Alternatively, the relevant reflective elements can also be provided in addition to the first and second facets, respectively, upstream thereof in the light propagation direction.

In accordance with one embodiment at least one of the relevant reflective elements can be adjustable in its position for the variation of the polarization direction of the light reflected at them.

In this case, the optical system can have an optical axis, wherein the adjustability of the reflective elements is provided along a circle arc about the optical axis.

According to a further aspect, the disclosure relates to a microlithographic exposure method,
wherein illumination light generated via a light source is fed to an illumination device of a projection exposure apparatus for illuminating an object plane of a projection lens, wherein the object plane is imaged in an image plane of the projection lens via the projection lens;
wherein the light passing through the illumination device has a degree of polarization of less than one at one position within the illumination device; and
wherein the degree of polarization is increased after this position in the direction of light propagation, wherein the light is split into a first partial ray and a second partial ray and wherein the first and the second partial ray have mutually orthogonal polarization directions.

The degree of polarization can in particular be increased by at least 0.3, more particularly by at least 0.6, more particularly by 0.9, and more particularly from the value zero to the value one.

According to a further aspect, the disclosure relates to a microlithographic exposure method,
wherein illumination light generated via an EUV light source is fed to an illumination device of a projection exposure apparatus for illuminating an object plane of a projection lens, wherein the object plane is imaged in an image plane of the projection lens via the projection lens;
wherein adjacent illumination spots created in a pupil plane of the illumination device have polarization states that are different from each other.

According to this aspect, the invention in particular enables to create, at least in regions, illumination settings with unpolarized light also in situations where the EUV-light (e.g. due to use of an at least partly polarized light source or due to undesired effects in the illumination device e.g. at reflective components) originally has already some degree of polarization. In this aspect, the disclosure is based on the concept to use closely neighboured polarized channels or spots, respectively, having polarization states different from each other and being adjacent/neighboured to each other in such a way that, e.g. on the wafer plane, the light of the respective regions of the pupil plane appears as being unpolarized, as described further below in more detail.

In accordance with one embodiment, at least some of the adjacent illumination spots created in a pupil plane of the illumination device have polarization states that are orthogonal to each other. However, the disclosure is not restricted thereto, and so it also encompasses configurations in which the different polarization states generated at adjacent positions in the illumination pupil differ from one another in some other way, for example by any desired angle between the relevant polarization directions. The disclosure is also not restricted to completely polarized illumination spots, but also comprises partly polarized spots with a degree of polarization between 0 and 1.

In accordance with one embodiment, at least some of the polarization states are superimposed to unpolarized light. However, the disclosure is not restricted thereto, and so it also encompasses configurations in which arbitrary other degrees of polarization (for example with DOP=50%) can be provided for certain regions of the illumination pupil.

In accordance with one embodiment, the method is performed using an optical system as described above. As to preferred embodiments or advantages achieved with the method, reference is made to the above remarks concerning the optical system.

The disclosure furthermore relates to a microlithographic projection exposure apparatus comprising an illumination device and a projection lens, wherein the illumination device has an optical system comprising the features described above, and to a method for microlithographically producing microstructured components.

Further embodiments of the disclosure can be gathered from the description and the dependent claims.

The disclosure will be explained in more detail below on the basis of the exemplary embodiments illustrated in the attached figures.

BRIEF DESCRIPTION OF THE DRAWINGS

In detail:

FIGS. 3A-3D; 4A-4B and 5 show schematic illustrations for explaining further embodiments of the disclosure;

FIGS. 7-14 show schematic illustrations for elucidating embodiments according to further aspects of the present disclosure.

DETAILED DESCRIPTION OF PREFERRED EMBODIMENTS

Figure 1:
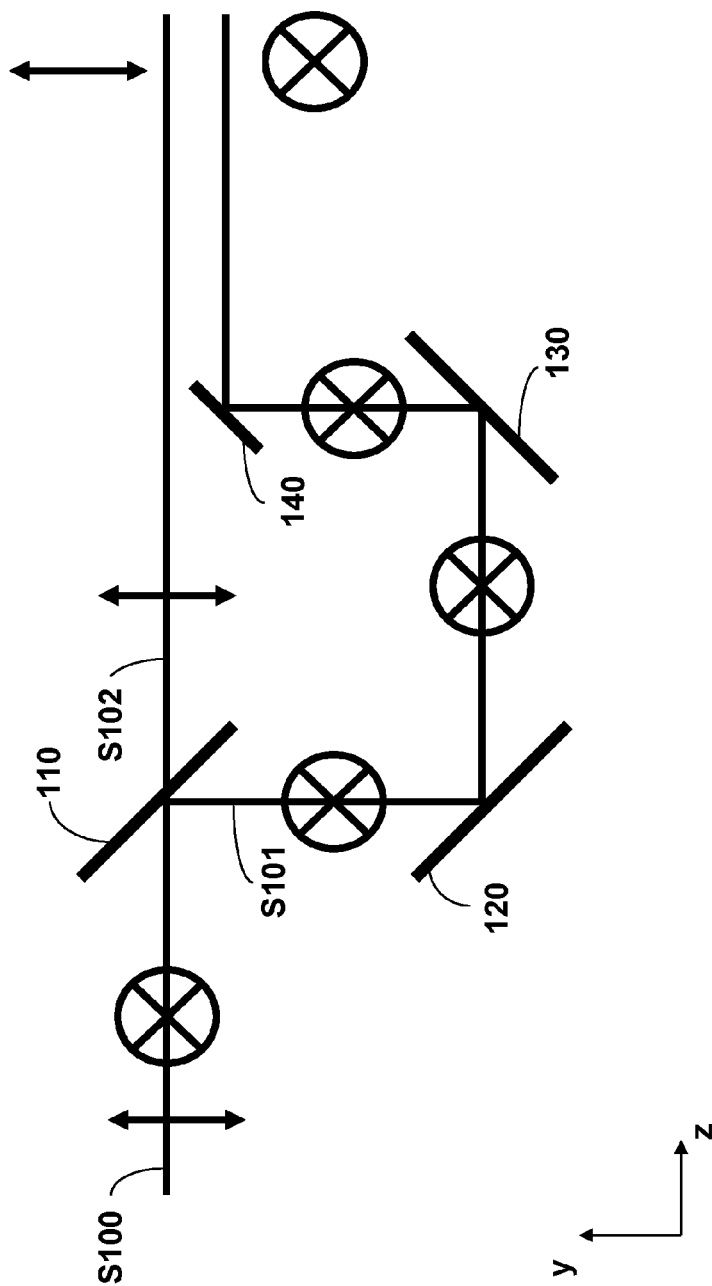
FIG. 1 shows a schematic illustration for explaining the principle underlying the present disclosure according to a first aspect.

FIG. 1 shows, in a schematic illustration, an arrangement for explaining the general concept of a first aspect of the present disclosure.

According to this first exemplary embodiment, unpolarized illumination light from a light source (not illustrated in FIG. 1) is decomposed into two mutually orthogonally polarized light beams or partial rays S101, S102 via a polarizing beam splitter 110 (merely indicated here). Here, the partial ray S102 transmitted through the polarizing beam splitter 110 is polarized in the y-direction in the plotted coordinate system and the partial ray S101 reflected on the polarizing beam splitter 110 is polarized in the x-direction. The unpolarized state of the input light incident on the polarizing beam splitter cube 110 is symbolized here and below by virtue of both polarization directions being plotted for this light ray.

Without the disclosure being restricted to this, the arrangement as per FIG. 1 furthermore has three deflection mirrors 120, 130 and 140, via which the partial ray S101 is once again aligned parallel to the partial ray S102. This is followed by suitable "further processing" of at least one of the partial rays S101, S102, as explained on the basis of the further exemplary embodiments, in order to set the ultimately desired polarized illumination setting in the illumination device.

Figure 2:
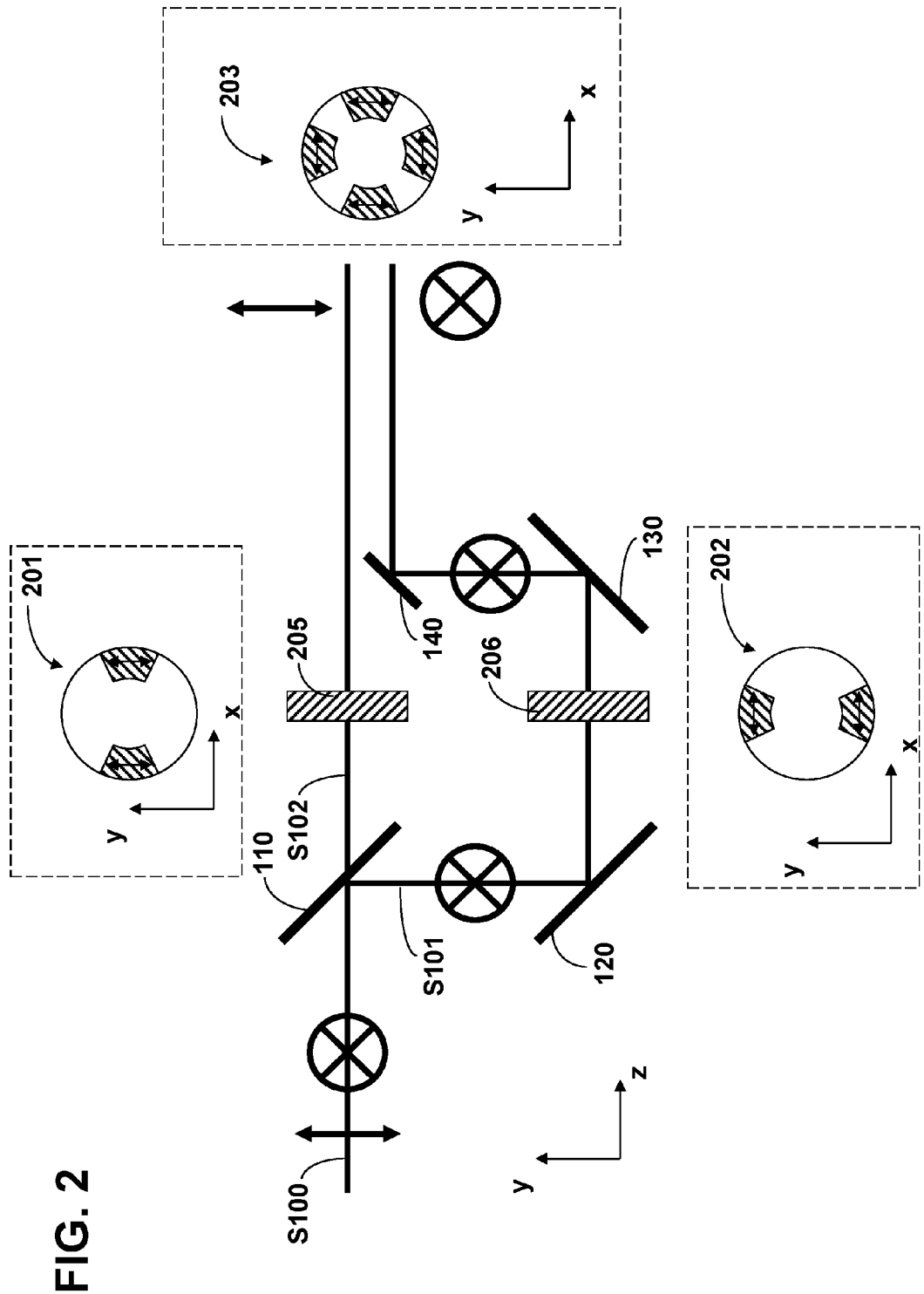
FIG. 2 shows a schematic illustration for explaining an embodiment of the present disclosure.

FIG. 2 shows an exemplary embodiment in which the desired polarized illumination setting 203, set according to the disclosure, is a quadrupole illumination setting with quasi-tangential polarization distribution, i.e. with a polarization distribution in which the oscillation direction of the electric field vector runs at least approximately perpendicular to the radius directed at the optical system axis (which runs in the z-direction in respect of the plotted coordinate system). To this end, according to FIG. 2, respectively one diffractive optical element (DOE) 205 and 206, respectively, is arranged in the ray path of each partial ray S101 or S102, which diffractive optical element guides the light, which emanates from the polarizing beam splitter 110 and has one of the two orthogonal polarization states, to the position in the pupil plane of the illumination device, fitting the relevant illumination setting. Effectively, the polarizing beam splitter 110 in conjunction with the respective DOE 205, 206 thus sets polarized "sub-pupils" 201, 202, the superposition of which in the pupil plane results in the ultimately desired polarized illumination setting 203. Specifically, the sub-pupil 201 generated in the exemplary embodiment by the DOE 205 in conjunction with the polarizing beam splitter 110 is a horizontal dipole illumination setting with y-polarization and the sub-pupil 202 generated by the DOE 206 in conjunction with the polarizing beam splitter 110 is a vertical dipole illumination setting with x-polarization.

In further exemplary embodiments, it is also possible to use a (optionally also respectively one) mirror arrangement in place of the DOEs 205, 206, the mirror arrangement having a plurality of mirror elements that can be adjusted independently of one another.

Furthermore, the disclosure is not restricted either to a specific implementation of the polarizing beam splitter 110, e.g. in the form of a beam splitter cube, but rather use can in principle be made of any suitable ray-splitting element, provided that it is suitable for the corresponding operating wavelength.

In order to implement the ray-splitting according to the disclosure in an illumination device, use can furthermore be made of a so-called sub-lambda grating (i.e. a grating with a grating structure spacing below the operating wavelength). Moreover, use can also be made of a multiple-layer membrane, in which a plurality of layers (with a width of the order of 10 nm) form a membrane such that when the latter is aligned at a suitable angle (typically at 45°), the desired polarization-sensitive ray broadening takes place.

In further embodiments, use can also be made of a birefringent element for ray-splitting, wherein use can be made of the property of birefringent materials in respect of the spatial separation between ordinary and extraordinary rays. In this case, an initially small ray deflection as a result of the birefringent element can be increased by further ray deflection(s), e.g. a further deflection by approximately 90°.

The arrangement in FIG. 2 is suitable, in particular, for implementation in conjunction with an illumination device in which the illumination light is generated by an unpolarized light source. Here, this can be e.g. a mercury short-arc discharge lamp, which generates light of the i-line with a wavelength of approximately 365 nm. Typically, as known from e.g. DE 44 12 053 A1 or EP 0 658 810 A1, such a mercury short-arc discharge lamp can be arranged in a focus of an elliptic mirror which collects the emitted light in the second focus.

Figure 3B:
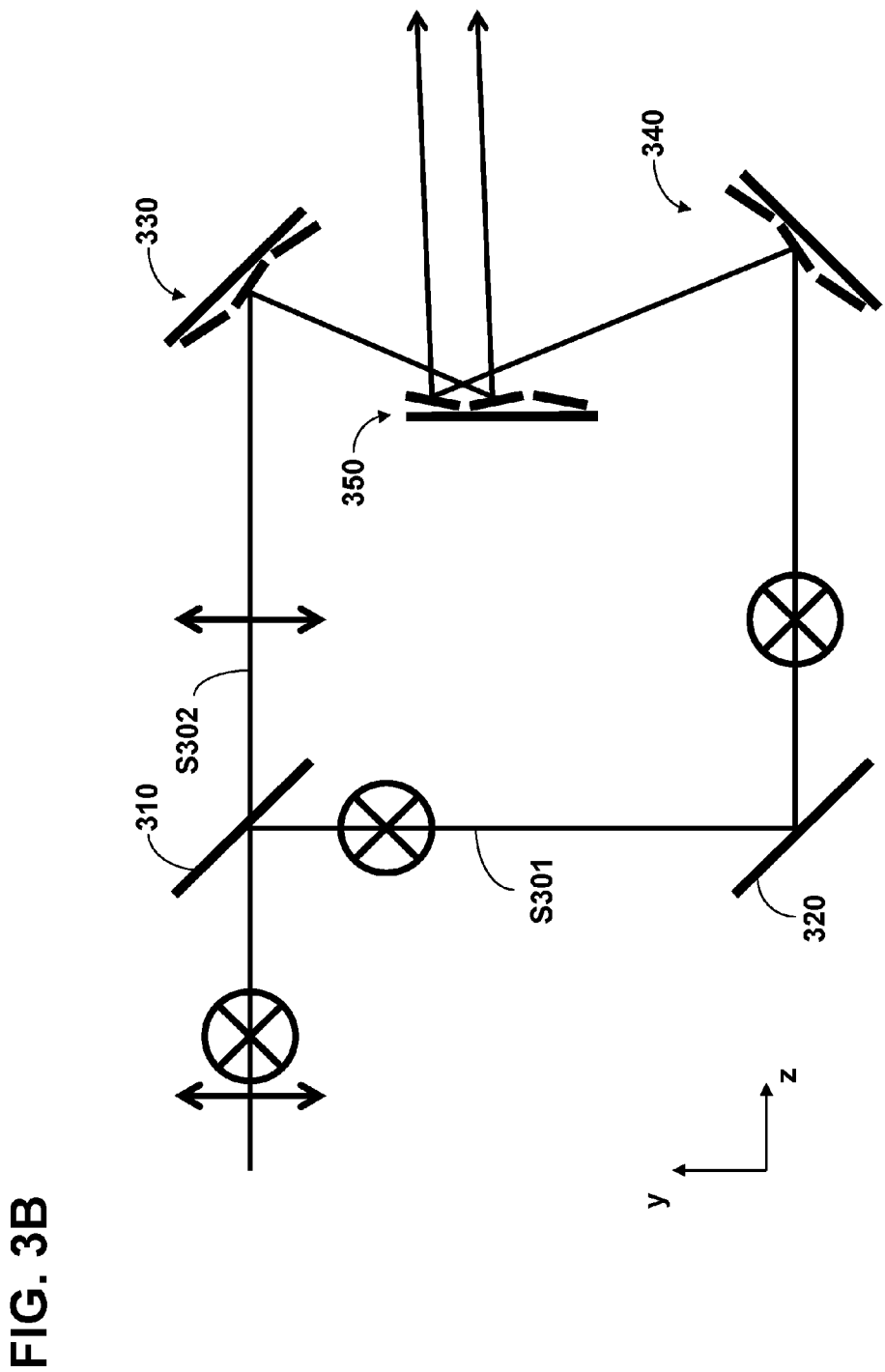
Figure 3C:
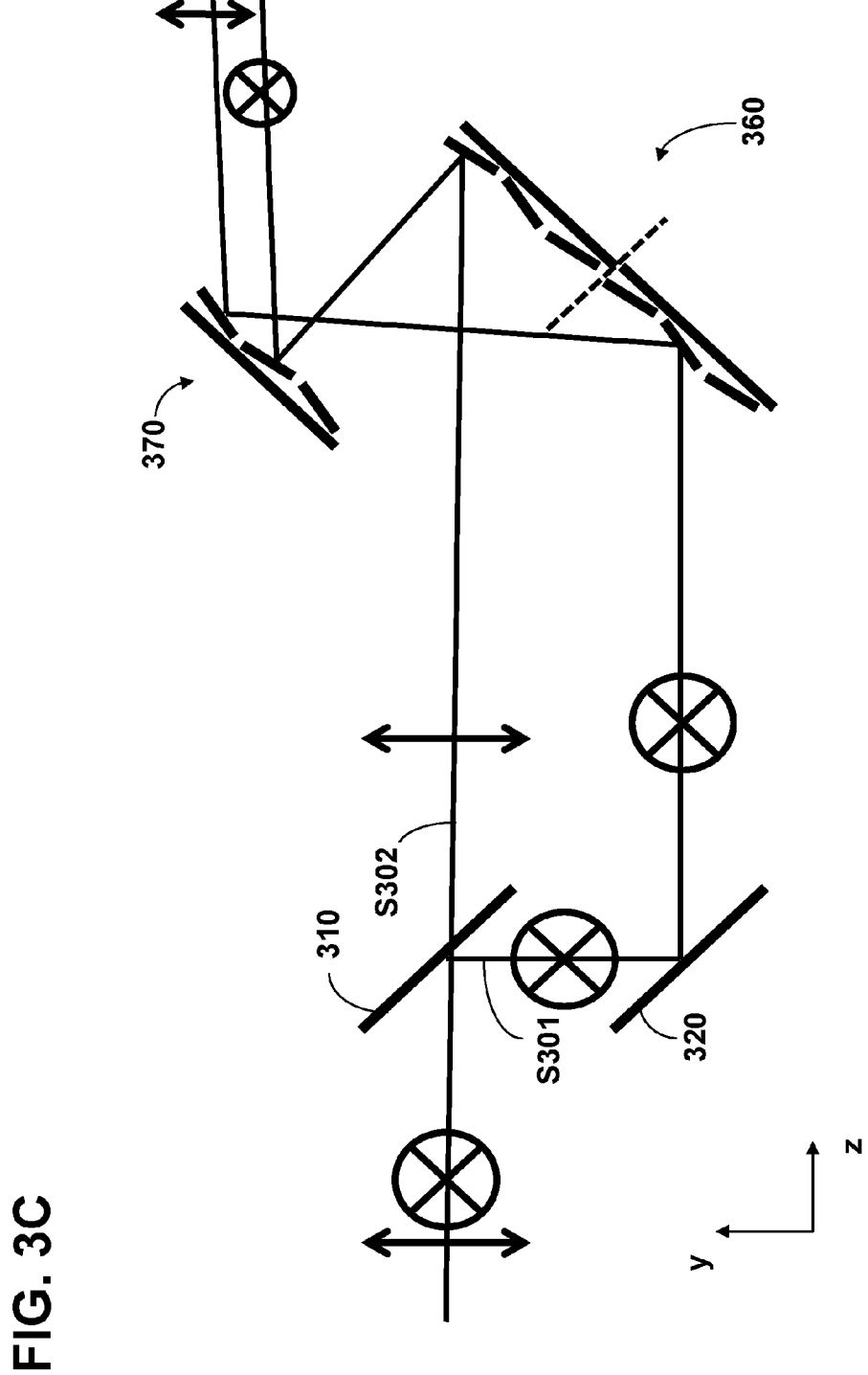
Figure 3D:
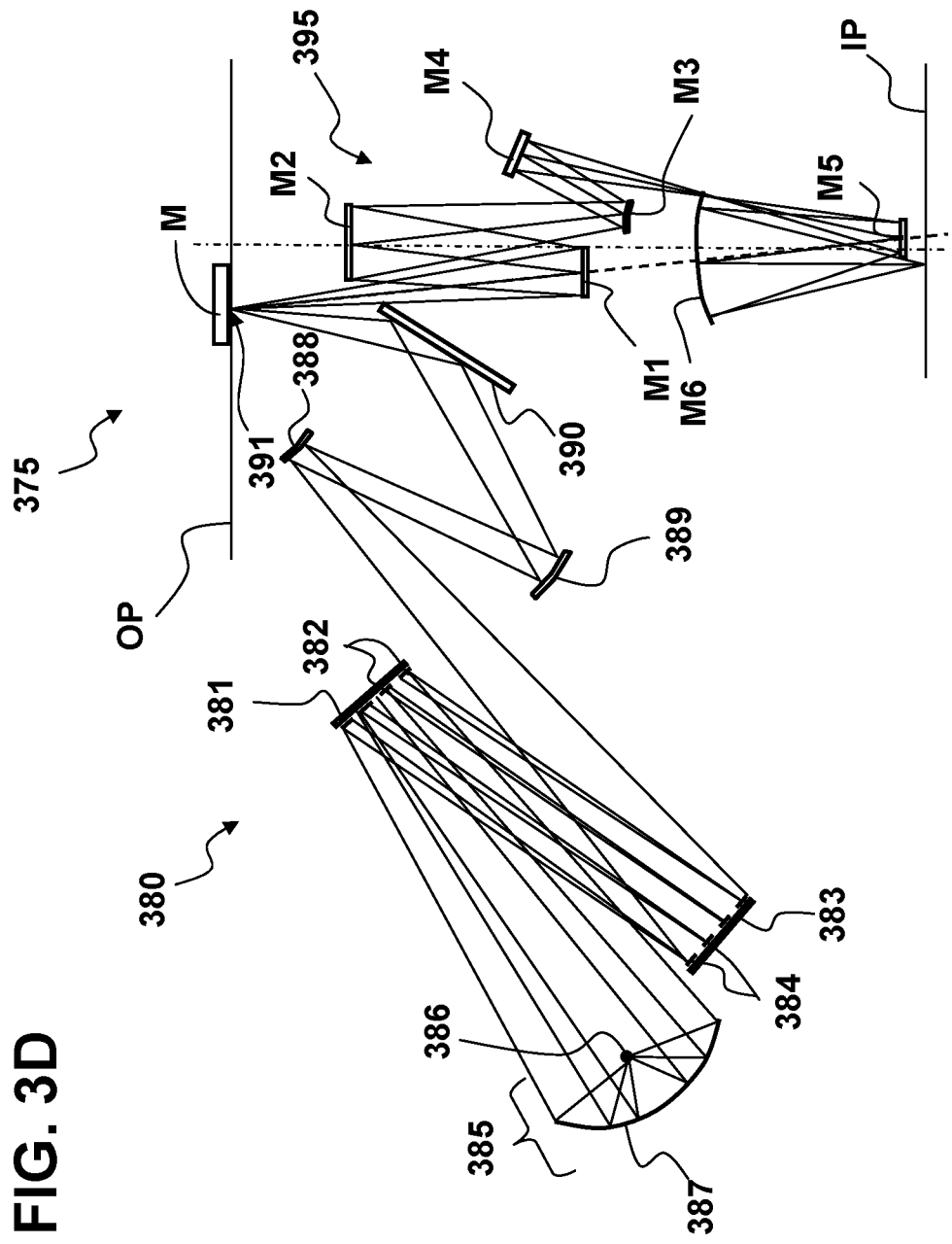

However, in further exemplary embodiments, the disclosure can also be implemented in conjunction with an illumination device designed for an operating wavelength in the EUV range (i.e. at wavelengths less than 15 nm), as merely illustrated schematically in FIG. 3D.

According to FIG. 3D, an illumination device 380 has, in a projection exposure apparatus 375 designed for EUV, a first facet mirror 381 with a plurality of first reflective facet elements 382 and a second facet mirror 383 with a plurality of second reflective facet elements 384. The light from a light-source unit 385, which comprises a plasma-light source 386 and a collector mirror 387, is directed at the first facet mirror 381. Arranged in the light path after the second facet mirror 383 there is a first telescope mirror 388 and a second telescope mirror 389. Arranged following this in the light path there is a deflection mirror 390, which guides the radiation incident thereon onto an object field 391 in the object plane OP of a projection lens 395 comprising six mirrors M1-M6. Arranged at the site of the object field 391 there is a reflective, structure-bearing mask M, which is imaged in an image plane IP with the aid of the projection lens 395.

In order to explain one implementation of the disclosure in such an illumination device designed for EUV, the schematic illustration as per 3A in turn shows the decomposition according to the disclosure of an initially unpolarized light ray S300 (as generated, for example, by an EUV-plasma-light source) into two light rays S301 and S302 with mutually orthogonal polarization states, with, in the shown exemplary embodiment and in the illustrated coordinate system, the light ray S302 being polarized in the y-direction and the light ray S301 being polarized in the x-direction. The ray-splitting element 310, which brings about the decomposition into the mutually orthogonal polarization states, can in this case be implemented by a zirconium film, wherein the thickness of the zirconium film can, merely in an exemplary fashion, be approximately 50 μm. This zirconium film is arranged in the ray path at an angle of 45° to the direction of light propagation (=z-direction in the plotted coordinate system). This angle corresponds to the Brewster angle because the refractive index of zirconium in EUV is close to the value 1.

The use of zirconium films in EUV lithography is known from e.g. EP 1 356 476 B1 and DE 10 2008 041 801 A1 for implementing spectral filters for the purpose of filtering out undesired components of the electromagnetic radiation, wherein, as described in EP 1 356 476 B1, the zirconium film can also be arranged between two silicon layers in order to prevent oxidation of the zirconium material.

As a result of the zirconium film used in the exemplary embodiment as per the present disclosure, the s-polarized light is reflected to the greatest possible extent and the p-polarized light is transmitted to the greatest possible extent. Specifically, such a zirconium film arranged at the Brewster angle can—taking into account the attenuation as a result of absorption in the material—achieve a transmission of approximately (70-80)% for the p-polarized light component and a reflection of likewise approximately (70-80)% for the s-polarized light component.

Now, in order, according to the disclosure, to minimize in turn a light loss during the increase in the degree of polarization, the mutually perpendicularly polarized partial rays generated as described above can respectively be fed to one of two partial modules provided parallel to one another within one and the same illumination device. By way of example, these partial modules can each have a separate field facet mirror, such that the partial rays emerging in the arrangement from FIG. 3A with mutually orthogonal polarization impinge on different field facet mirrors. The field facet mirrors generate different intensity distributions (i.e. in a certain sense they detect the function of the DOEs 205, 206 in the arrangement in FIG. 2), before there is renewed coupling into a single illumination device.

Alternatively, the mutually perpendicularly polarized partial rays generated as per FIG. 3A for illumination light with an operating wavelength in EUV can also be coupled into two separate EUV illumination devices from the outset.

FIG. 3B shows an embodiment in which the mutually orthogonally polarized partial rays S301 and S302, generated by splitting the initially unpolarized light, are routed onto facets of a third facet mirror 350 via a first and second facet mirror 330, 340, respectively. The facets of the third facet mirror 350 can alternate between at least two switching positions, in which they capture the light from respectively one facet of the first facet mirror 330 or of the second facet mirror 340. As a result, starting from the partial rays S301 and S302, this makes it possible to implement different polarized illumination settings by suitably selecting the switching positions of the facets of the third facet mirror 350.

FIG. 3C shows a further embodiment, in which the mutually orthogonally polarized partial rays S301 and S302, generated by splitting the initially unpolarized light, are routed to facets of a second facet mirror 370 via a first facet mirror 360 with two spatially separate regions (indicated in FIG. 3C by the dashed line in the facet mirror 360). The facets of the second facet mirror can alternate between at least two switching positions, in which they capture the light from respectively one facet of the regions of the first facet mirror 360. As a result, starting from the partial rays S301 and S302, this makes it possible to implement different polarized illumination settings by suitably selecting the switching positions of the facets of the second facet mirror 370.

FIG. 4A shows a further embodiment of the disclosure, wherein elements that are analogous to or substantially have the same function as those in FIG. 2 are denoted by reference signs with a value increased by "300". Analogously to the arrangement of FIG. 2, the one in FIG. 4A is likewise suitable, in particular, for implementation in conjunction with an illumination device, in which the illumination light is generated by an unpolarized light source using the i-line and having an operating wavelength in the DUV range.

The design as per FIG. 4A differs from the one as per FIG. 2 by virtue of the fact that ultimately a polarized illumination setting 401 in the form of a dipole illumination setting with constant preferred polarization direction (running in the y-direction in the plotted coordinate system) is generated, i.e. a so-called horizontal dipole illumination setting with y-polarization.

Figure 4B:
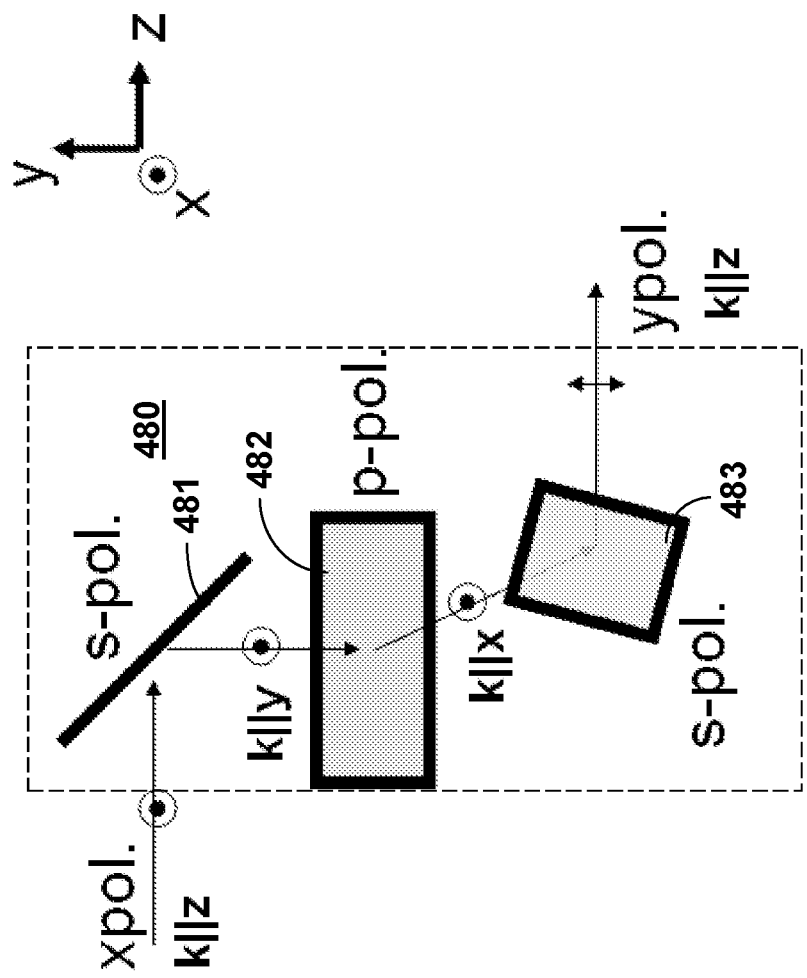

To this end, the arrangement as per FIG. 4A has a 90° rotator 450 arranged in the ray path of the partial ray S401 and also a diffuser 460 arranged in the ray path of both partial rays S401, S402 in place of the DOEs 205, 206 from FIG. 2. By way of example, the diffuser 460 can be implemented as a diffusing screen or a fly's eye condenser. By way of example, the 90° rotator 450 can be made from optically active material (in particular crystalline quartz with the optical crystal axis oriented parallel to the direction of light propagation or z-direction) or else implemented using linear birefringence (i.e. assembled as lambda/2 plate made of linear birefringent, optically uniaxial material or, in a known fashion, from two lambda/2 plates with an optical crystal axis rotated by 45° relative to one another). Moreover, in place of the DOEs 205 and 206 provided in the design in FIG. 2, the arrangement as per FIG. 4A only has a single DOE 470, which is arranged in the ray path of both partial rays S401 and S402 and downstream of the diffuser 460 in the direction of light propagation and guides the respective linearly polarized partial rays S401 and S402 (now, as illustrated schematically in FIG. 4A-4B, polarized in the same fashion, namely in the y-direction) to the desired regions in the pupil plane of the illumination device in order to implement the illumination setting 401 schematically illustrated in FIG. 4A.

It goes without saying that a separate DOE can alternatively also be provided in each case for both partial rays S401 and S402—analogously to the case in FIG. 2. Moreover, as an alternative to the arrangement shown in FIG. 4A, it is also possible to dispense with the diffuser 460 and a mixture of the two partial rays S401 and S402 can be achieved purely by using a suitable DOE.

In further embodiments, as a modification of the design shown in FIG. 4A, it is also possible to use a three-dimensional mirror arrangement with three (skew) mirrors 481, 482, 483 in order to implement the 90° rotation of the polarization direction for the partial ray S401, as illustrated schematically in FIG. 4B and known from e.g. WO 2009/152867 A1. The mirrors 481-483 analogously to FIG. 4A form a rotator which can also be used in conjunction with an illumination device designed for EUV.

Figure 5:
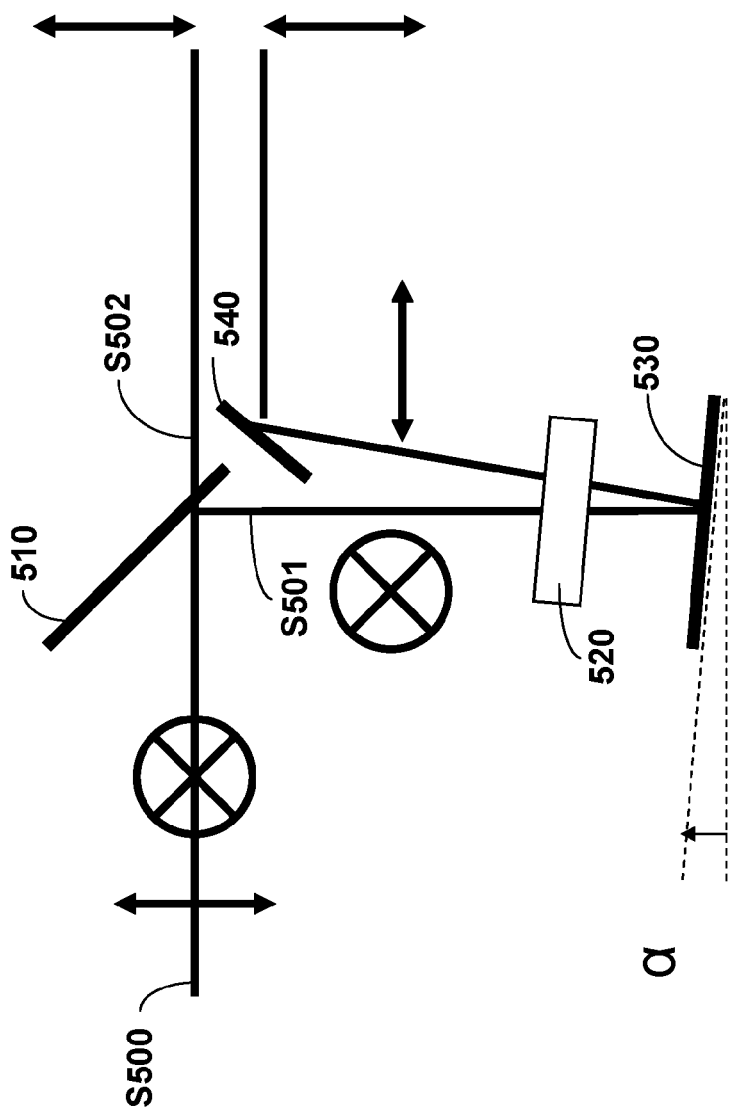
Figure 6:
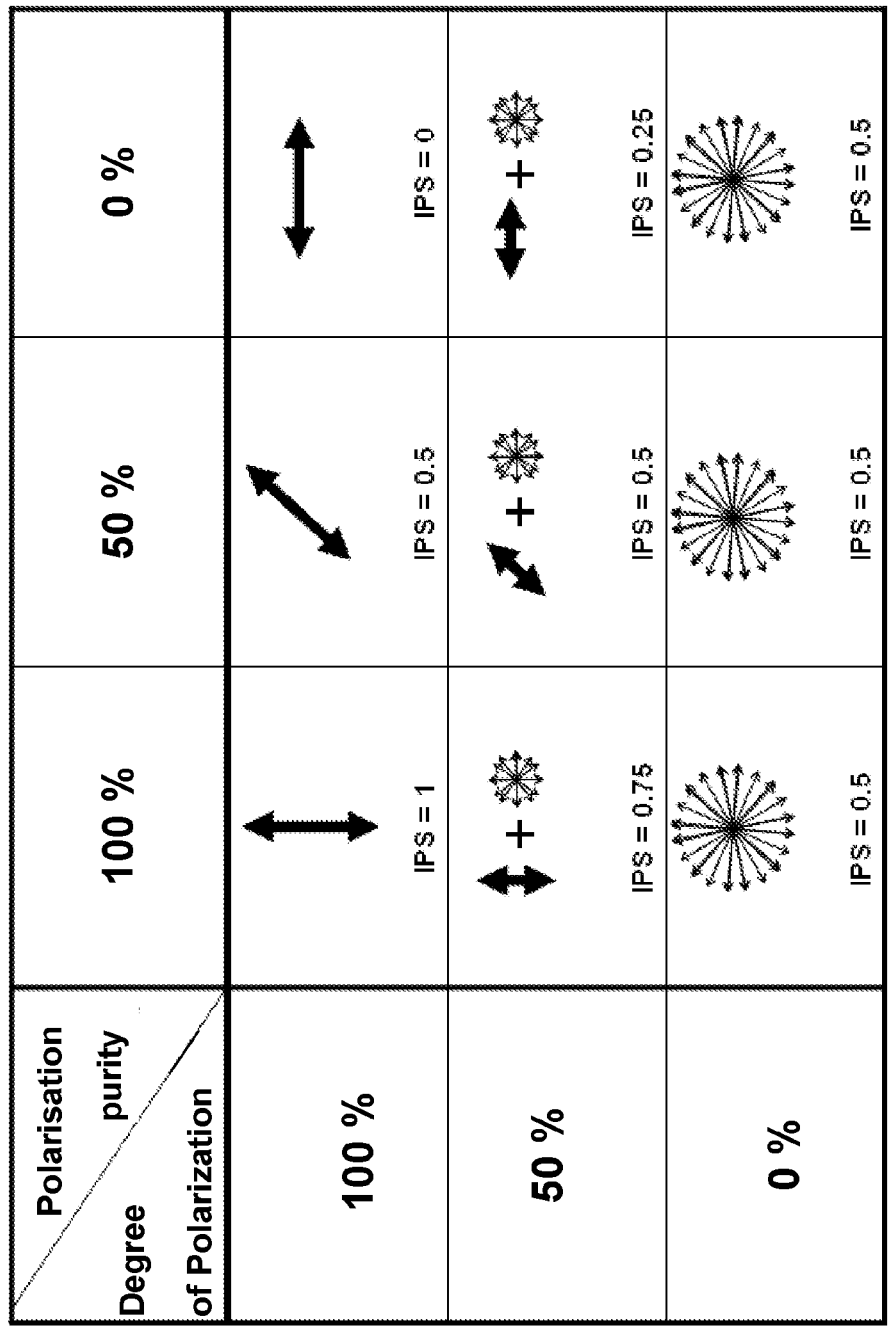
FIG. 6 shows a diagram for explaining an aim underlying the disclosure according to the first aspect.

FIG. 5 serves in a schematic illustration for explaining a further exemplary embodiment, in which the 90° rotation of the polarization direction according to the disclosure for one of two partial rays can be implemented. Analogously to the embodiments described above on the basis of FIG. 2 and FIG. 4A-4B, this exemplary embodiment is likewise suitable, in particular, for implementation in conjunction with an illumination device, in which the illumination light is generated by an unpolarized light source using the i-line and having an operating wavelength in the DUV range.

In the arrangement of FIG. 5, the partial ray S501 (polarized in the x-direction in respect of the plotted coordinate system) which is reflected at the ray-splitting element 510 is routed twice through a lambda/4 plate 520, the fast axis of which is oriented at 45° to the polarization direction of the incident light. Since the twice run-through lambda/4 plate effectively acts as a lambda/2 plate, a 90° rotation of the polarization state for the partial ray S501 is implemented. This is brought about via a mirror 530, which is arranged after the lambda/4 plate 520 in the direction of light propagation with respect to the partial ray S501 and which is tilted at a preferably small angle of e.g. α<10° relative to the z-direction or the original direction of light propagation of the light ray S500. After the lambda/4 plate 520 has been run through twice and hence a rotation of the polarization direction through approximately 90° has been completed, a further mirror 540 brings about another deflection parallel to the partial ray S502, which is already polarized in the y-direction after passing through the ray-splitting element 510, and so, as a result, substantially the whole illumination light coupled into the arrangement of FIG. 5 is available with a uniform polarization state, specifically with a constant polarization direction running in the y-direction.

It goes without saying that provision can also be made in the arrangement of FIG. 5 for a once run-through lambda/2 plate instead of the twice run-through lambda/4 plate 520 in order to achieve a rotation of the polarization direction through approximately 90° for the partial ray S501.

Figure 7:
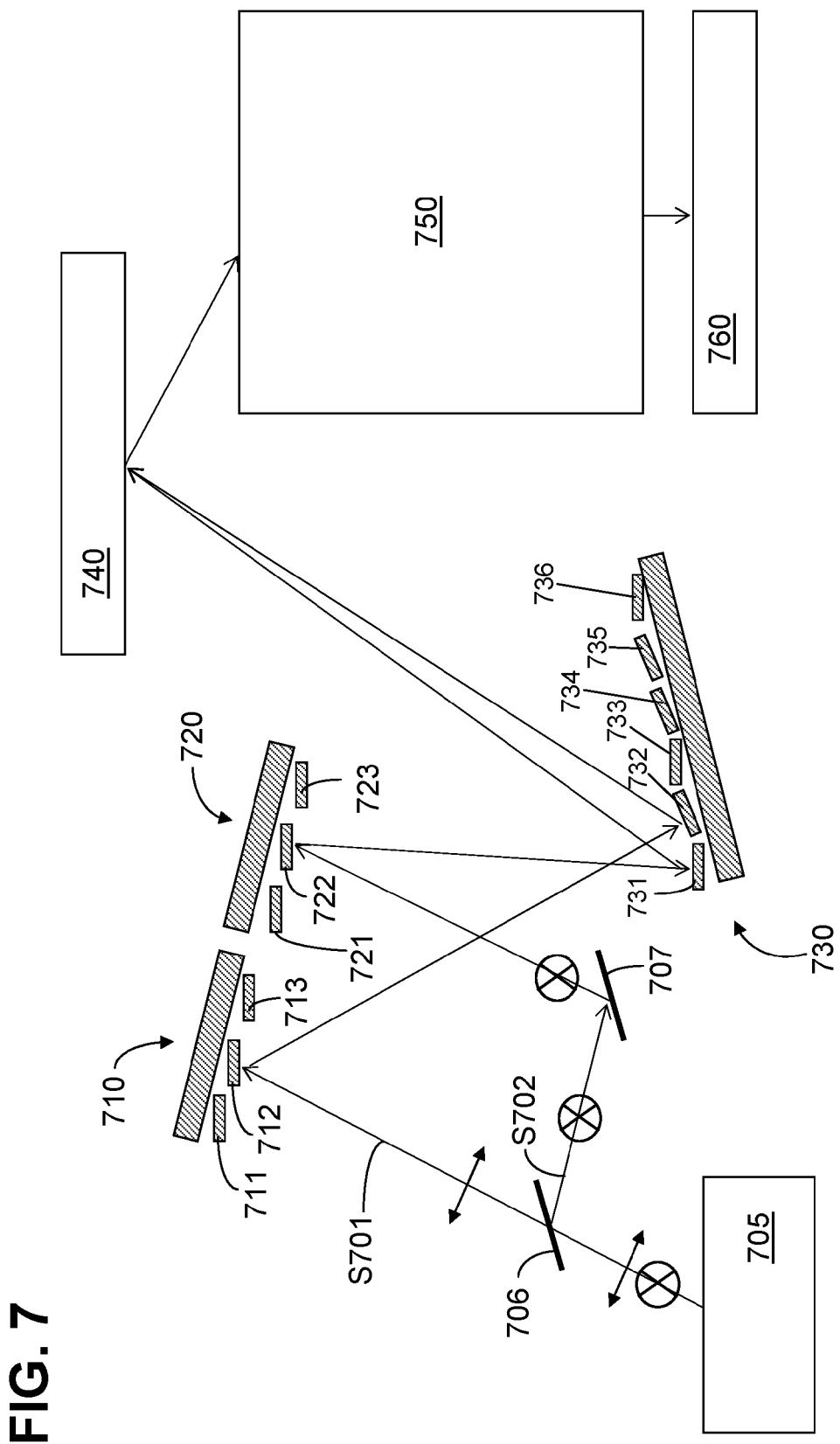

FIG. 7 shows, in schematic illustration, a further embodiment of the present disclosure.

In accordance with FIG. 7, light passes from an EUV plasma light source 705 via a polarization-influencing optical arrangement composed of elements 706, 707, which arrangement will be described in greater detail below, onto one of two arrangements of first and second facets 711, 712, 713 and 721, 722, 723, respectively, and from these onto an arrangement of third facts 731, 732, 733, . . . disposed downstream in the light propagation direction. From the facets 731, 732, 733, . . . , the light impinges—if appropriate via a further ray-deflecting element (not illustrated)—on a mask 740 arranged in an object plane of a projection lens 750, the mask having structures to be imaged, which are imaged with the aid of the projection lens 750 onto a wafer 760 arranged in an image plane of the projection lens 750.

Firstly the abovementioned polarization-influencing optical arrangement inserted between the EUV plasma light source 705 and the first and second facets 711, 712, 713 and 721, 722, 723, respectively, in FIG. 7 will now be explained in greater detail below.

In accordance with FIG. 7, the unpolarized illumination light generated by the EUV plasma light source 705 is split via a ray-splitting elements 706, merely indicated, into two light bundles or partial rays S701, S702 polarized orthogonally with respect to one another. The arrangement in accordance with FIG. 7 furthermore comprises (without the disclosure being restricted thereto) a ray-deflecting element 707 in the form of a deflection mirror, via which the partial ray S702 is aligned parallel to the partial ray S701 again.

The above-described ray-splitting element 706 that brings about splitting into the mutually orthogonal polarization states can be realized, in particular, by a zirconium film, wherein the thickness of the zirconium film can be merely by way of example approximately 50 μm. The zirconium film is arranged in the beam path at an angle of 45° with respect to the light propagation direction (=z-direction in the coordinate system depicted). The angle corresponds to the Brewster angle since the reflective index of zirconium in the EUV is close to the value 1 as already mentioned above.

The unpolarized state of the input light impinging on the ray-splitting element 706 is symbolized in FIG. 7 by both polarization directions (s and p) being depicted for this light ray. Via the zirconium film used in the exemplary embodiment according to the present disclosure, the s-polarized light is reflected to the greatest possible extent, and the p-polarized light is transmitted to the greatest possible extent. Specifically, via such a zirconium film arranged at the Brewster angle—taking account of attenuation on account of absorption in the material—it is possible to obtain a transmission of approximately (70-80)% for the p-polarized light portion and a reflection of likewise approximately (70-80)% for the s-polarized light portion. In accordance with FIG. 7, therefore, the partial ray S701 transmitted by the ray-splitting element 706 is p-polarized, and the partial ray S702 reflected at the ray-splitting element 706 is s-polarized in accordance with FIG. 7.

In accordance FIG. 7, the p-polarized partial ray S701 transmitted by the ray-splitting element 706 impinges on a first field facet mirror 710 having a plurality of first facets (of which only three facets 711, 712, 713 are illustrated for the sake of simplicity), whereas the s-polarized partial ray S702 reflected at the ray-splitting element 706 impinges on a second field facet mirror 720 having a plurality of second facets (of which likewise only three facets 721, 722, 723 are illustrated for the sake of simplicity). Typically, the number of first and second facets, respectively, is significantly higher, and can be for example more than 10, in particular also more than 100.

A pupil facet mirror 730 having a plurality of third facets (of which only six facets 731-736 are illustrated for the sake of simplicity) is arranged downstream of the first and second field facet mirrors 710, 720, respectively, in the light propagation direction. The number of third facets, too, is typically significantly higher, and can be for example more than 10, in particular also more than 100.

Light channels are defined by the facets 731-736 of the pupil facet mirror 730 in a manner known per se (e.g. from DE 10 2008 002 749 A1), in principle, in conjunction with the first and second facets 711, 712, 713 and 721, 722, 723, respectively, which light channels guide the illumination light channel by channel to the object field or the mask 740 arranged in the object plane of the projection lens 750.

According to the disclosure, the third facets 731-736 are switchable by the variation of the tilting angle of each facet 731-736 about at least one tilting axis in such a way that with each of the third facets 731-736 it is possible to switch between in each case a facet of the first facets 711-713 that is assigned to the relevant third facet and a facet of the second facets 721-723 that is assigned to the relevant third facet in the sense that optionally either the light reflected at the relevant first facet or the light reflected at the relevant second facet can be captured by the third facet or reflected at the latter, in order in this way to correspondingly select the polarization state of the relevant light spot generated in the pupil plane. In further embodiments, the tilting angle of each facet 731-736 can also be variable about more than one tilting axis, in particular about two tilting axes, which is expedient, in particular, if three or more polarization directions are intended to be set and in this case the tilting angles are intended to be kept as small as possible.

The generation—realized in the embodiment in FIG. 7—of the different polarization states of the light directed onto the first and second facets, respectively, has the advantage that the light from the light source 705 that is originally unpolarized in accordance with FIG. 7 can be converted particularly effectively or without loss of light into light having the respectively desired polarization state. However, the disclosure is not restricted to this configuration, and so in further embodiments, e.g. as explained below with reference to FIG. 8 et seq., the different polarization states of the light reflected at the first and second facets, respectively, can also be generated differently.

Furthermore, the disclosure is not restricted to the above-described realization of the different polarization states as mutually orthogonal polarization states. Rather, the disclosure also encompasses configurations in which the different polarization states generated by one and the same facet of the third facets 731-736 of the pupil facet mirror 730 differ from one another in some other way, for example by any desired angle between the relevant polarization directions.

Figure 8:
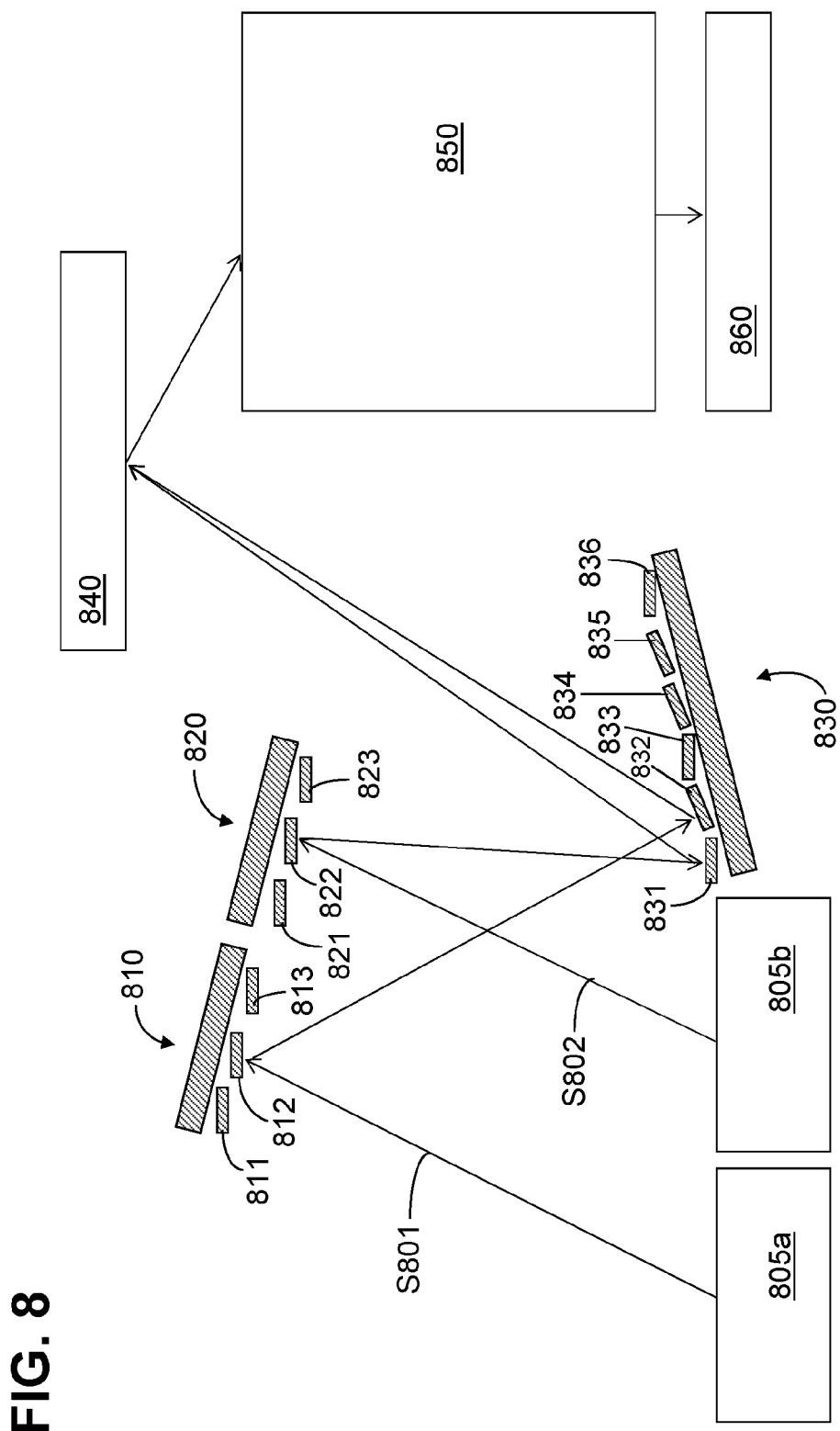

FIG. 8 shows, in a merely schematic illustration, a further embodiment of the disclosure, wherein analogous or substantially functionally identical components in comparison with FIG. 7 are designated by corresponding reference numerals increased by "100". The embodiment in FIG. 8 differs from that from FIG. 7 in that the light directed onto the first facets 811, 812, 813, . . . and the second facets 821, 822, 823, . . . , respectively, is coupled in by two light sources 805a, 805b, which generate polarized light from the outset, for instance by using a polarization-optical component as known e.g. from US 2008/0192225 A1.

In further embodiments of the disclosure, it is also possible to provide more than two polarized light sources 805a, 805b, . . . and correspondingly also more switching positions of the third facets 831, 832, 833, . . . of the pupil facet mirror.

The disclosure is not restricted to the realization of the first and second facets, respectively, in two respectively continuous regions spatially separated from one another, nor, in particular, is it restricted to the arrangement of the first and second facets, respectively, on two separate field facet mirrors 710, 720, as shown in FIG. 7.

In further embodiments, the above-described first and second facets can also be provided in two spatially separated regions of one and the same facet mirror, in particular once again of a field facet mirror.

Furthermore, in further embodiments, e.g. as indicated in FIG. 9, the first facets 911, 912, 913, . . . and the second facets 921, 922, 923, . . . can also be provided in an alternate arrangement on one and the same facet mirror 900. Such a configuration has the advantage that two facets respectively assigned to one and the same facet of the pupil facet mirror and having different assigned polarization states can e.g. also in each case be arranged directly adjacent and thus require, for a "changeover" of the polarization state of the relevant light spot, smaller switching distances or tilting angles of the relevant assigned facet of the pupil facet mirror.

Both in accordance with FIG. 7 and in accordance with FIG. 8, as described above, the partial rays S701, S702 and S801, S802, respectively, polarized orthogonally with respect to one another are directed via the first and second facets of the facet mirrors 710, 720 and 810, 820, respectively, onto third facets of the pupil facet mirror 730 and 830, respectively, the third facets being arranged downstream thereof in the light propagation direction. The third facets of the pupil facet mirror 730 and 830, respectively, can change between at least two switching positions in which they capture the light from respectively one of the first facets (with a first polarization state) or one of the second facets (with a polarization state orthogonal with respect to the first polarization state). As a result, different polarized illumination settings (i.e. different polarization distributions generated in the pupil plane) can be realized in this way through a suitable choice of the switching positions of the third facets of the pupil facet mirror. In embodiments of the disclosure, it is also possible to provide a continuous settability of the tilting angles of the respective third facets of the pupil facet mirror 730 and 830, respectively.

A description is given below, with reference to FIGS. 10 and 11, of embodiments of the disclosure in which the different polarization states selectable by the third facets of the pupil facet mirror are in each case generated by a reflection at a reflective element, the reflection being effected at the Brewster angle.

Figure 10:
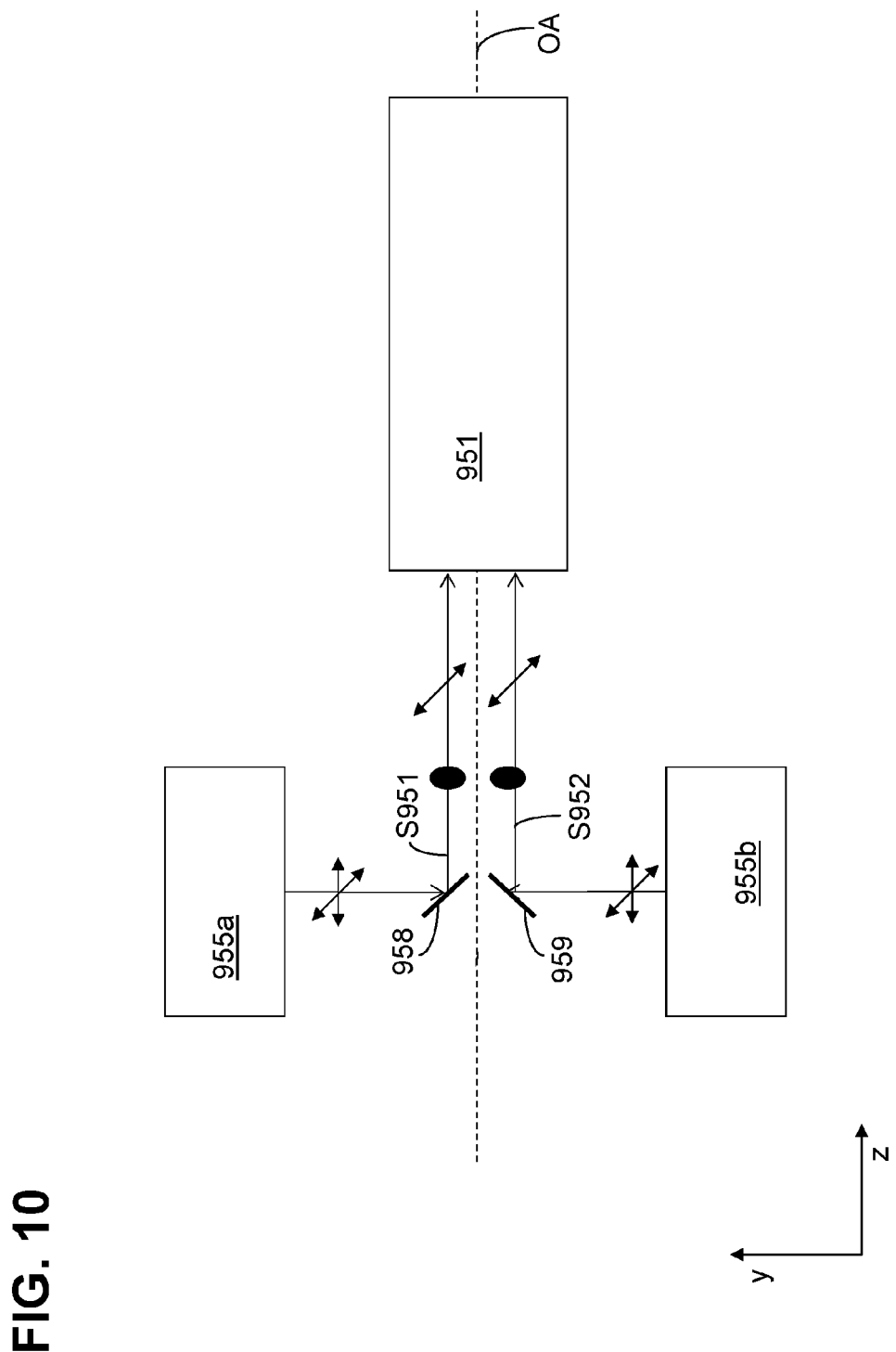

In this case, firstly with reference to FIG. 10, the first, second and third facets and likewise the associated facet mirrors are not illustrated, wherein, with regard to the construction thereof, the above explanations in connection with FIGS. 7-9 are analogously applicable and wherein these components are in each case part of the illumination device 951, merely indicated schematically.

In accordance with FIG. 10, then, reflective elements 958, 959 are provided in addition to the first and second facets (which are not illustrated in FIG. 10), respectively, upstream of the first and second facets (belonging to the illumination device 951), respectively, in the light propagation direction. The reflective elements 958, 959 are arranged at an angle relative to the optical axis, which angle corresponds to the Brewster angle, in order subsequently to obtain linearly polarized light in the reflection. In the case of EUV, this corresponds to an angle of 45° for virtually all appropriate materials.

In this case, it is possible to make use of the fact that the polarization direction of the linearly polarized light directed onto the respective first or second facet analogously as described in connection with FIGS. 7-9 is dependent on the angle of the relevant light source and of the associated reflective element 958, 959, at which the reflection is effected at the Brewster angle, with respect to the y-z plane in the coordinate system depicted in FIG. 10.

While in the case of corresponding arrangement (as depicted in FIG. 10) of the reflective elements 958, 959 in each case perpendicular to the y-z plane, the polarization directions of the linearly polarized light reflected from the elements 958, 959 at the Brewster angle also correspond, the polarization directions can in each case be altered independently of one another and, in particular, also be set orthogonally with respect to one another by virtue of one or both light sources 955a, 955b together with the assigned reflective element 958 and 959, respectively, being tilted about the optical axis OA running in the z-direction or being rotated out of the y-z plane, that is to say by the variation of the azimuthal alignment of the relevant light source 955a, 955b in the plane perpendicular to the optical axis OA.

In one exemplary arrangement, for instance, one of the two light sources 955a, 955b can be rotated out of the y-z plane by an angle of 90°, such that the light ray generated by the light source is emitted both perpendicularly to the optical axis OA and perpendicularly to the light ray generated by the respective other light source.

This tilting or rotation of one of the light sources 955a, 955b together with the assigned reflective element 958 and 959, respectively, about the optical axis OA or rotation out of the y-z plane can be effected, in particular, in a variable manner along a circle arc (lying in a plane perpendicular to the optical axis, or x-y plane), as a result of which the polarization direction of the corresponding partial ray S951 and S952, respectively, can be set as desired.

Moreover, with regard to the arrangement of the first and second facets, respectively, of the field facet mirror and of the third facets of the pupil facet mirror, the above explanations in connection with FIGS. 7-9 are analogously applicable, such that the relevant facets are not illustrated again in FIG. 10 as part of the illumination device 951.

Figure 11:
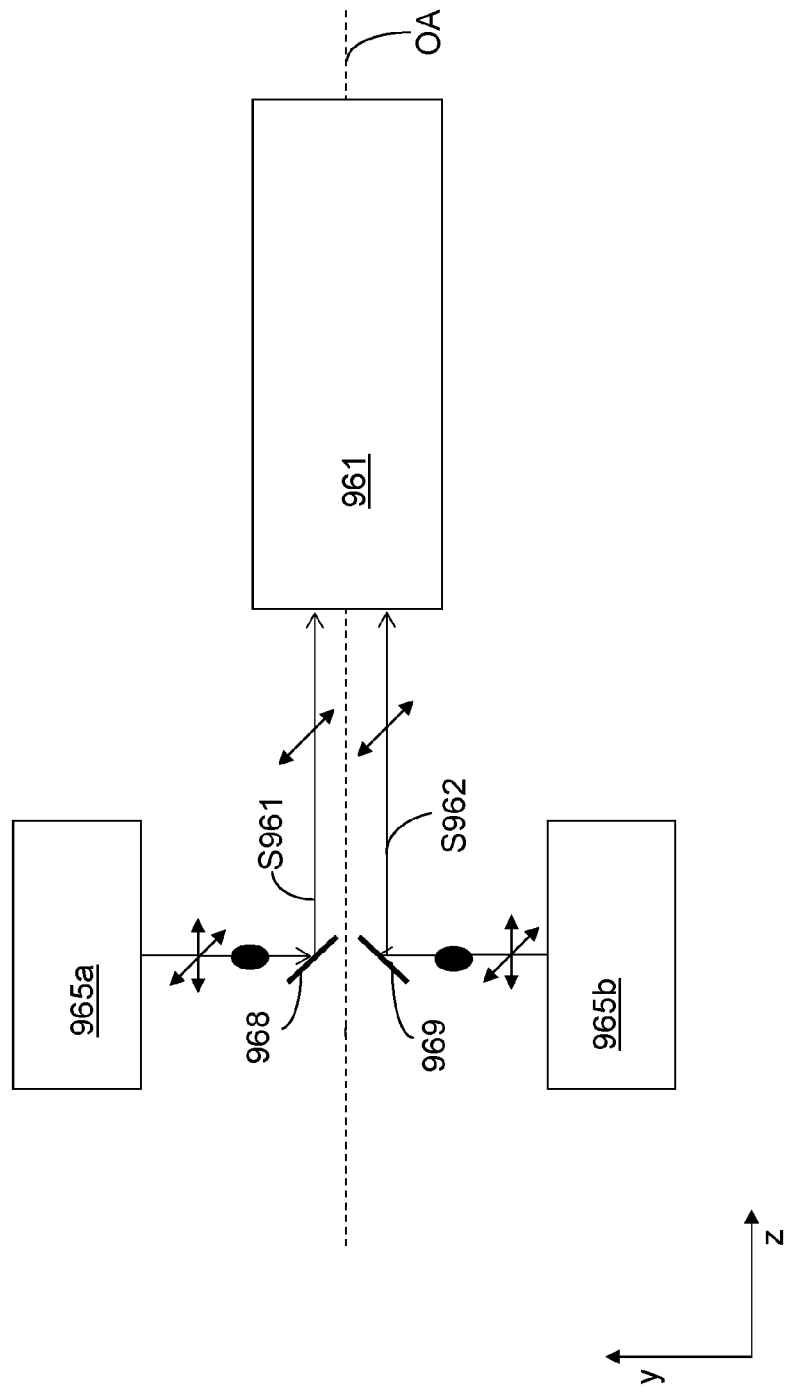

FIG. 11 shows a further embodiment of the disclosure, which differs from that from FIG. 10 merely in that the first and second facets, respectively, of the field facet mirror themselves are used as reflective elements at which the reflection is effected at the Brewster angle. In other words, the functions of the facet mirror firstly and the function of the generation of a specific polarization state are respectively combined in one and the same element (namely the facets 968, 969). As a result, it is possible as it were to save a reflection and to avoid the loss of light associated therewith on account of the restricted reflection. FIG. 11 depicts, for illustration purposes, the relevant facets 968, 969 that bring about the generation of the desired polarization state by reflection at the Brewster angle upstream of the downstream optical system 961 (containing the remaining components of the illumination device). For the rest, with regard to the adjustability for the purpose of varying the polarization state respectively set, the explanations in connection with FIG. 10 are analogously applicable.

For realizing the above embodiments in the projection exposure apparatus 375 of FIG. 3D, then, the field facet mirror 381 can be configured analogously to the embodiments described above with reference to FIGS. 7 to 11 with an arrangement composed of a plurality of first facets and at least a plurality of second facets, wherein the first facets and the second facets are assigned different polarization states of the light reflected at the respective facets during the operation of the projection exposure apparatus. The pupil facet mirror 383 is correspondingly configured with an arrangement composed of a plurality of third facets in such a way that the third facets are in each case switchable between a first switching position, in which they capture light from one of the first facets, and at least one second switching position, in which they capture light from one of the second facets.

As a result, this affords the possibility of realizing a flexible change in the polarization or in the polarization distribution generated in the pupil plane of the illumination device during the operation of the projection exposure apparatus, without this necessitating, for instance, the replacement of polarization-influencing elements in the system.

According to a further aspect of the present disclosure, the flexibility in generating different polarizations or polarization distributions, respectively, that can be achieved according to the present disclosure e.g. using the embodiments described above with respect to FIG. 7ff., can also be used in order to provide illumination settings that comprise, at least in regions, unpolarized light. While such at least partly unpolarized illumination settings can be advantageous or desired depending on the specific application, the creating of the respective unpolarized regions can generally raise problems in particular in EUV systems due to non-availability of appropriate transmissive optical components (such as e.g. a so-called Hanle-depolarizer, which can be used in VUV systems in combination with a light mixing system in order to produce unpolarized light).

As described in the following in more detail with respect to FIGS. 12 to 14, such at least partly unpolarized illumination settings can be realized, in particular in an EUV system, using—just by way of an example and without the disclosure being limited thereto—the facet arrangements described with respect to FIG. 7ff.

Figure 12:
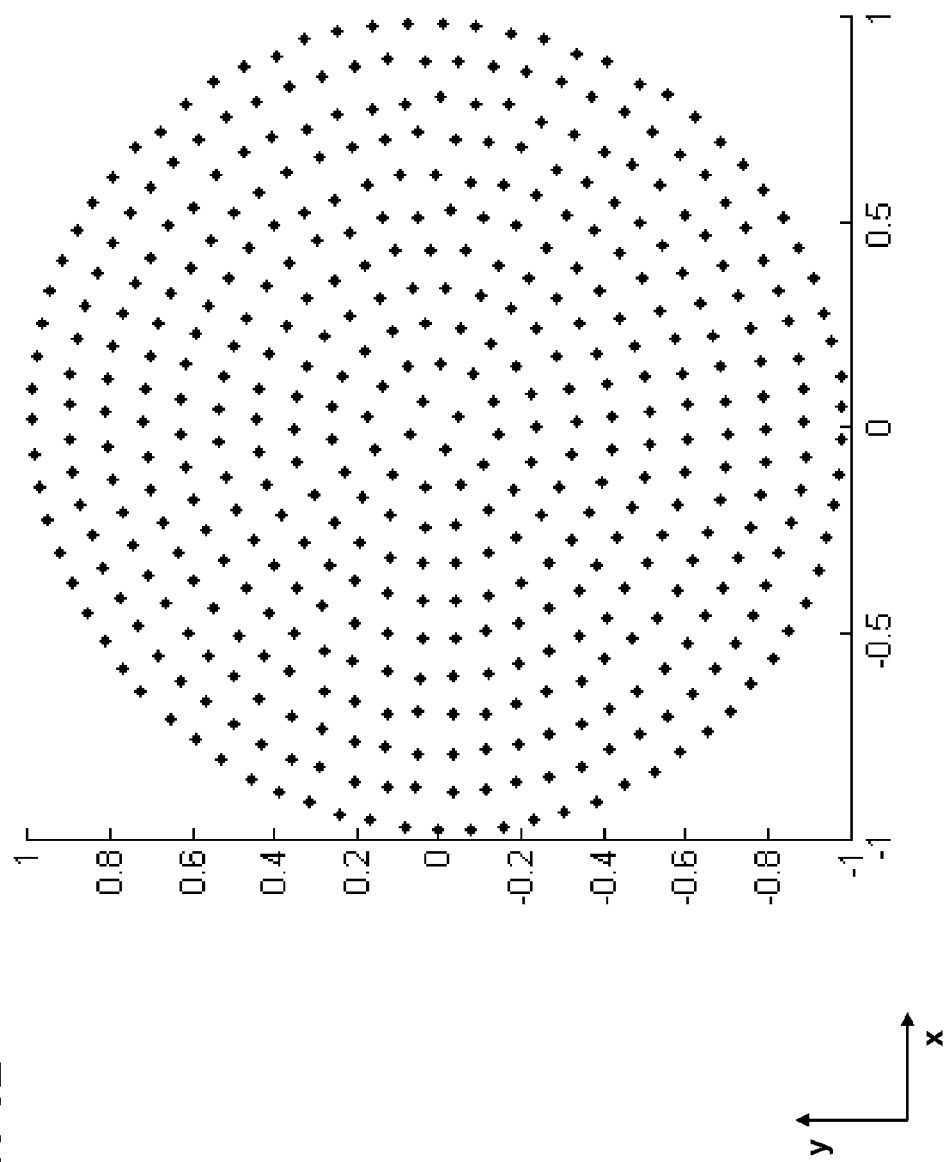

According to this aspect, the disclosure exploits the fact that in an illumination device being designed for EUV, the illumination pupil (rather than being continuously filled as the case may be in VUV systems) exhibits a pronounced parceling by comprising a plurality of illumination spots as schematically shown in FIG. 12. By exploiting this strongly parceled illumination pupil, a desired depolarization can be achieved by providing respective adjacent illumination spots with polarization states that are different from each other. As a consequence of this concept, different polarization states are provided in adjacent/neighboured regions of the illumination light over the cross section thereof, which can to some extend be compared with the concept of a Hanle-depolarizer.

The above-mentioned different polarization states can either be statistically distributed or can result from a selective, targeted adjustment of the polarization of the separate illumination spots, e.g. by providing an alternating sequence of orthogonal polarization states (for example such that adjacent regions of the illumination pupil are polarized in x- or y-direction, respectively), such that the respective Stokes vectors across a certain region of the illumination pupil at least approximately add up to unpolarized light, e.g. with a degree of polarization (=DOP) less than 10%, in particular less than 5%, and more particularly less than 2%.

In further embodiments, also more fine/stepwise polarization variations across adjacent illumination spots can be realized. A real unpolarized polarization distribution can be achieved from the illustrated different (e.g. orthogonal) polarization states in adjacent illumination spots for example as a result of a mixing of the light or illumination spots, respectively, which can e.g. be achieved by providing an appropriate microstructure on reflective components of the illumination device (such as the facets in the embodiments of FIG. 7ff). In further embodiments, the mixing of the different polarization states attributed to adjacent illumination spots can also be achieved in the wafer plane (i.e. on the light sensitive layer provided on the substrate) as a result of the superposition of the electrical fields of the individual separate illumination spots.

Figure 13:
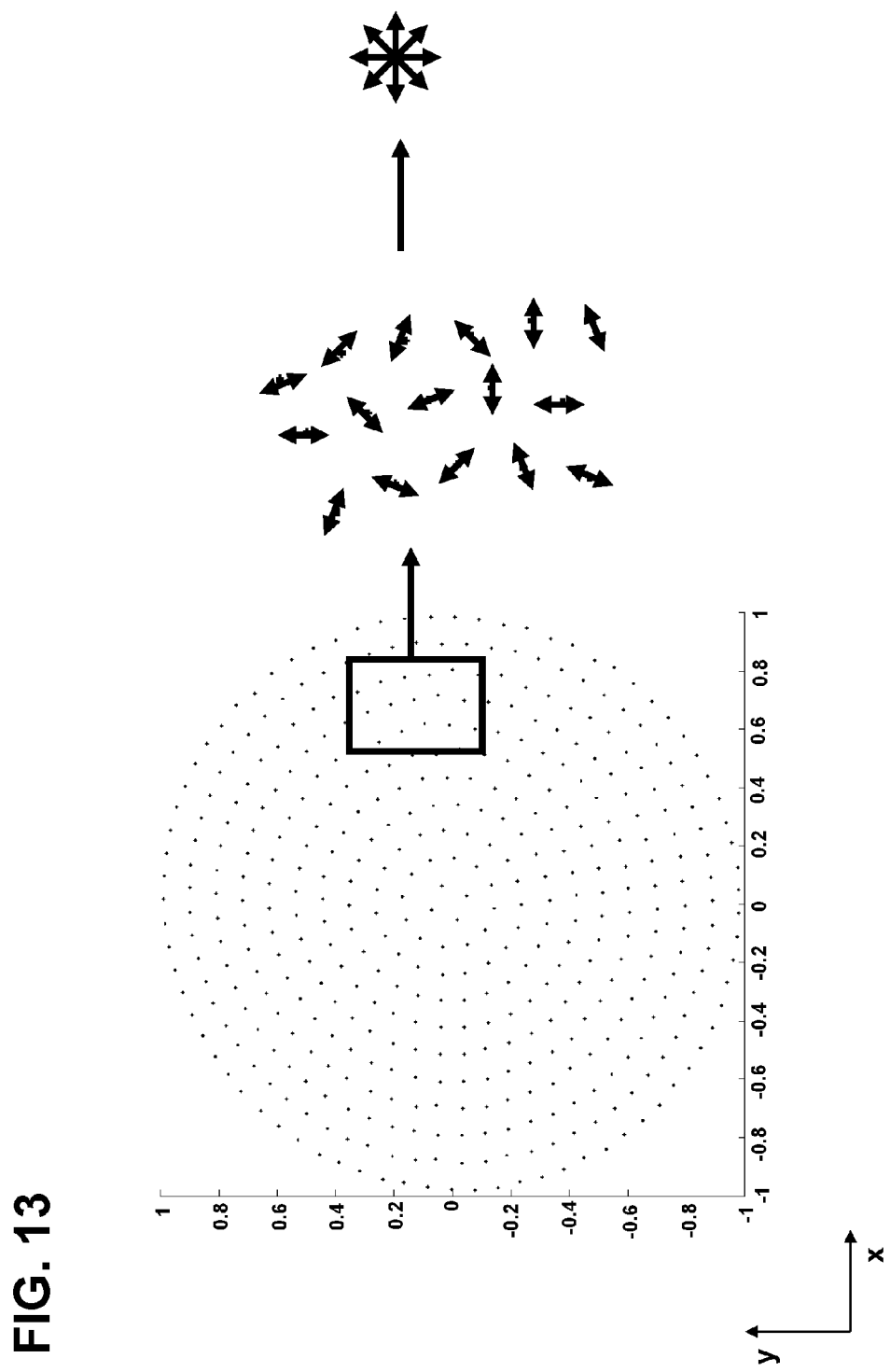

FIG. 13 serves to illustrate the above concept. As schematically shown in the diagram of FIG. 13, the desired unpolarized state is achieved as the result of averaging illumination spots across a certain region of the illumination pupil, as further discussed below in more detail.

Figure 14:
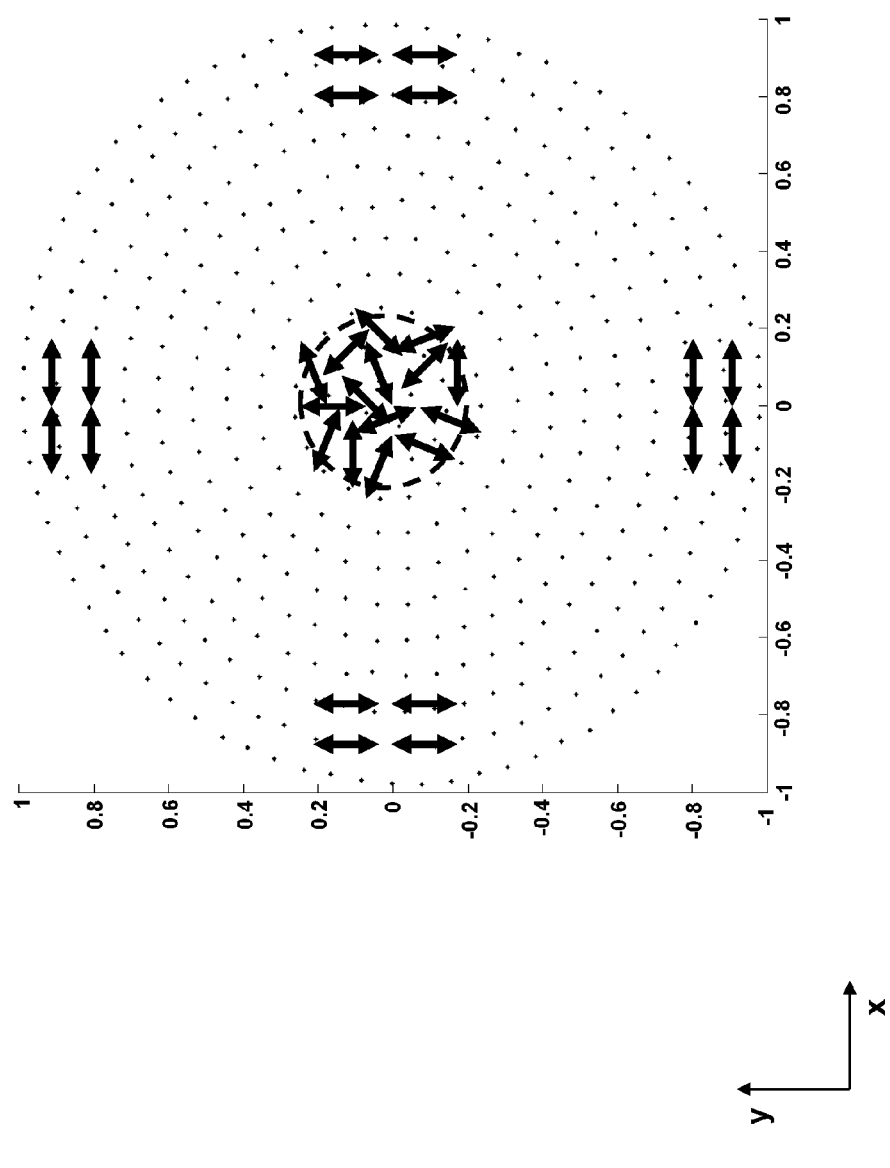

As a possible result of the above concept, FIG. 14 shows, just by way of an example and without the disclosure being limited thereto, an illumination setting which can be described as a combination of a quasi-tangentially polarized quadrupole setting with an unpolarized "low sigma"-setting (i.e. a setting comprising unpolarized light in a central, circular-shaped region of the illumination pupil). It is to be noted in that respect that the diagrams of FIGS. 12 to 14 are using on the respective axis pupil coordinates, with $\sigma=0$ at the center of the pupil and $\sigma=1$ at the outer edge of the pupil, and that only the illumination poles for which double arrows show the respective direction of polarization are illuminated with light.

A quantitative specification of the achieved "depolarizing effect" can be given based on a floating averaging that is performed across the illumination pupil, for which the averaging kernel can e.g. have a radius in pupil coordinates of $0.1*\sigma$ (in particular of $0.05*\sigma$, more particularly of $0.02*\sigma$). The scale on which still different polarization states are obtained in the illumination pupil as illustrated in FIGS. 13 and 14 has to be small enough so that such an averaging yields, for the respective unpolarized region such as e.g. the central circular-shaped region of the illumination pupil shown in FIG. 14, a residual degree of polarization (=DOP) less than 10%, in particular less than 5%, and more particularly less than 2%. The region for which the afore-mentioned floating averaging is performed can consist, depending on the desired illumination pupil or the aimed depolarization, of one or more separate illumination poles (including, if given, a central circular-shaped region of the illumination pupil as "low-sigma-region", i.e. region with small $\sigma$-values of e.g. $\sigma<0.1$). With other words, the afore-mentioned floating averaging can be made separately for each illumination pole or also be made across several illumination poles such as the illumination poles of a dipole setting.

The disclosure with respect to the aspect of FIG. 12-14 is not limited to the creation of at least substantially unpolarized light. Rather, also arbitrary other degrees of polarization (for example with DOP=50%) can be provided for certain regions of the illumination pupil using the high flexibility obtained e.g. via the embodiments described with respect to FIG. 7ff.

By using dynamically switchable arrangements/facets as described with respect to FIG. 7ff (which enable a variation of the tilting angle of each facet of a field facet mirror or the pupil facet mirror, respectively), also a dynamical change or switching can be realized in operation between different polarization settings and, in particular, between polarized and unpolarized illumination in certain regions of the illumination pupil. Further, the disclosure with respect to the aspect of FIG. 12-14 is not limited to the use of arrangements with dynamically switchable facets described with respect to FIG. 7ff, but can also be realized in static embodiments of a field facet mirror or the pupil facet mirror, respectively.

Even though the disclosure has been described on the basis of specific embodiments, numerous variations and alternative embodiments are evident to the person skilled in the art, e.g. by combination and/or exchange of features of individual embodiments. Accordingly, it goes without saying for the person skilled in the art that such variations and alternative embodiments are concomitantly encompassed by the present disclosure, and the scope of the disclosure is restricted only within the meaning of the accompanying claims and the equivalents thereof.

The invention claimed is:

1. An optical system, comprising:
a first element configured so that, during use of the optical system, the first element splits a light ray incident on the first element into first and second partial rays, the first partial ray having a polarization direction which is orthogonal to a polarization direction of the second partial ray;
a second element configured so that, during use of the optical system, the second optical element generates a polarized illumination setting from the first and second partial rays;
a first arrangement comprising a plurality of first facets and a plurality of second facets, the first facets and second facets configured so that, during use of the optical system, the first and second facets are assigned different polarization states of the light reflected at the respective facets; and
a second arrangement comprising a plurality of third facets configured to that, during use of the optical system, the third facets are downstream of the first and second facets in a propagation direction of the light through the optical system,
wherein:
the first element is arranged so that, during use of the optical system, light incident on the first element has a degree of polarization of less than one;
for each of the third facets:
the third facet is switchable between first and second positions;
during use of the optical system when the third facet is in the first position, the third facet captures light from a first facet; and
during use of the optical system when the third facet is in the second position, the third facet captures light from a second facet;
the optical system has a pupil plane;
the optical system is configured so that, during use of the optical system, adjacent illumination spots in the pupil plane have polarization states that are different from each other; and
the optical system is a microlithographic optical system.

2. The optical system of claim 1, wherein the first element is arranged so that, during use of the optical system, the degree of polarization of the light incident on the first element is less than 0.5.

3. The optical system of claim 1, wherein the polarized illumination setting has a quasi-tangential polarization distribution.

4. The optical system of claim 1, wherein the polarized illumination setting is a quadrupole illumination setting or a dipole illumination setting.

5. The optical system of claim 1, further comprising a light source configured to generate the light.

6. The optical system of claim 5, wherein the light is unpolarized light.

7. The optical system of claim 5, wherein the light source is an EUV plasma source.

8. An apparatus, comprising:
an illumination device comprising an optical system according to claim 1; and
a projection lens,
wherein the apparatus is a microlithographic projection exposure apparatus.

9. A method of using an apparatus comprising an illumination device and a projection lens, the method comprising:
using the illumination device to illuminate an object plane of the projection lens; and
using the projection lens to project the object plane into an image plane,
wherein the illumination device comprises the optical system of claim 1.

10. The optical system of claim 1, wherein the optical system is configured so that, during use of the optical system, all illumination spots in the pupil plane comprise polarized light.

11. An optical system, comprising:
a first light source configured to generate polarized light;
a second light source configured to generate polarized light;
a first arrangement comprising a plurality of first facets and a plurality of second facets, the first facets and second facets configured so that, during use of the optical system, the first and second facets are assigned different polarization states of light reflected at the respective facets; and
a second arrangement comprising a plurality of third facets configured so that, during use of the optical system, the third facets are arranged downstream of the first and second facets in a propagation direction of the light through the optical system,
wherein:
the optical system is a microlithographic optical system;
the optical system is configured so that during use of the optical system:
polarized light from the first light source impinges on the first facets; and
the polarized light from the second light source impinges on the second facets; and
for each of the third facets:
the third facet is switchable between first and second positions;
during use of the optical system when the third facet is in the first position, the third facet captures light from a first facet; and
during use of the optical system when the third facet is in the second position, the third facet captures light from a second facet.

12. The optical system of claim 11, wherein the optical system comprises first and second field facet mirrors, wherein the first field facet mirror comprises the first facets, and the second field facet mirror comprises the second facets.

13. The optical system of claim 11, wherein the optical system comprises a pupil facet mirror, and the pupil facet mirror comprises the third facets.

14. The optical system of claim 11, wherein the different polarization states are orthogonal with respect to one another.

15. The optical system of claim 11, wherein the optical system is configured so that, during use of the optical system, each of polarization state is generated via a reflection at a reflective element at the Brewster angle.

16. An apparatus, comprising:
an illumination device comprising an optical system according to claim 11; and
a projection lens,
wherein the apparatus is a microlithographic projection exposure apparatus.

17. A method of using an apparatus comprising an illumination device and a projection lens, the method comprising:
using the illumination device to illuminate an object plane of the projection lens; and
using the projection lens to project the object plane into an image plane,
wherein the illumination device comprises the optical system of claim 11.

18. The optical system of claim 11, wherein the optical system is configured so that, during use of the optical system:
the polarized light from the second light source does not impinge on the first facets; and
the polarized light from the first light source does not impinge on the second facets.

* * * * *

UNITED STATES PATENT AND TRADEMARK OFFICE
CERTIFICATE OF CORRECTION

PATENT NO. : 9,500,956 B2  
APPLICATION NO. : 14/143878  
DATED : November 22, 2016  
INVENTOR(S) : Ingo Saenger et al.

Page 1 of 1

It is certified that error appears in the above-identified patent and that said Letters Patent is hereby corrected as shown below:

On the Title Page

Item (54) and in the Specification, Column 1, Line 4, after "EXPOSURE", insert
-- METHOD --.

In the Specification

Column 1, delete Lines 9-15, and insert -- The present application is a continuation of, and claims priority under 35 USC 120 to, international application PCT/EP2012/063102, filed Jul. 5, 2012, which claims priority under 35 USC 119 to German Patent Application 10 2011 079 837.4 and priority under 35 USC 119e to U.S. Provisional Application No. 61/511,645, both filed on Jul. 26, 2011. International application PCT/EP2012/063102 further claims priority under 35 USC 119 to German Patent Application 10 2012 203 959.7 and priority under 35 USC 119e to U.S. Provisional Application No. 61/610,675, both filed on Mar. 14, 2012. The content of these applications is hereby incorporated by reference. --.

Column 9, Line 22, delete "3A" and insert -- FIG. 3A --.

Column 12, Line 4, delete "facts" and insert -- facets --.

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*